US012737007B2

(12) United States Patent
Meng et al.

(10) Patent No.: US 12,737,007 B2
(45) Date of Patent: Sep. 15, 2026

(54) CONNECTION STRUCTURE AND ELECTRONIC DEVICE

(71) Applicant: Honor Device Co., Ltd., Shenzhen (CN)

(72) Inventors: Yin Meng, Shenzhen (CN); Yang Fan, Shenzhen (CN); Weiwei Xie, Shenzhen (CN); Lingyu Bi, Shenzhen (CN); Xuyang Wang, Shenzhen (CN)

(73) Assignee: Honor Device Co., Ltd., Shenzhen (CN)

( * ) Notice: Subject to any disclaimer, the term of this patent is extended or adjusted under 35 U.S.C. 154(b) by 126 days.

(21) Appl. No.: 18/863,161

(22) PCT Filed: Oct. 18, 2023

(86) PCT No.: PCT/CN2023/125285

§ 371 (c)(1),
(2) Date: Nov. 5, 2024

(87) PCT Pub. No.: WO2024/114151

PCT Pub. Date: Jun. 6, 2024

(65) Prior Publication Data

US 2025/0306633 A1 Oct. 2, 2025

(30) Foreign Application Priority Data

Nov. 29, 2022 (CN) ......................... 202211511521.4
Feb. 24, 2023 (CN) ......................... 202310204554.2

(51) Int. Cl.

| | |
|---|---|
| ***G06F 1/16*** | (2006.01) |
| ***G06F 1/183*** | (2026.01) |
| ***H05K 9/00*** | (2006.01) |

(52) U.S. Cl.
CPC ............ *G06F 1/1633* (2013.01); *G06F 1/183* (2013.01); *H05K 9/0088* (2013.01)

(58) Field of Classification Search
CPC ... H09K 9/0073; H09K 9/0081; H09K 9/0088
(Continued)

(56) References Cited

U.S. PATENT DOCUMENTS 12,592,988 B2 * 3/2026 Meng .................... H04M 1/026
2014/0210675 A1 * 7/2014 Hwang .................... H01Q 1/44
343/702

(Continued)

FOREIGN PATENT DOCUMENTS

CN 110165443 A 8/2019
CN 211957930 U 11/2020

(Continued)

*Primary Examiner* — Adrian S Wilson
(74) *Attorney, Agent, or Firm* — Leydig, Voit & Mayer, Ltd.

(57) ABSTRACT

Embodiments of this application provide a connection structure and an electronic device. The electronic device includes at least a middle frame, a metal structural member, and a fastener; the metal structural member has a first through hole, the middle frame has a second through hole, and the fastener passes through the first through hole and the second through hole; at least one through groove is provided on the metal structural member, a surface of the through groove facing away from the middle frame is recessed, and the through groove extends to at least one outer edge of the metal structural member; and a surface of the through groove facing the middle frame is protruded. In this way, existence of a gap between the metal structural member and the middle frame in scenarios such as falling can be avoided, and a problem of poor overall performance of the electronic device.

18 Claims, 23 Drawing Sheets

(58) Field of Classification Search
USPC .................. 361/816, 818; 174/350, 384, 385
See application file for complete search history.

(56) References Cited

U.S. PATENT DOCUMENTS

| | | | | |
|---|---|---|---|---|
| 2016/0255182 | A1 | 9/2016 | Lee et al. | |
| 2024/0129395 | A1* | 4/2024 | Wang | G06F 1/1698 |
| 2024/0388648 | A1* | 11/2024 | Meng | H04M 1/026 |
| 2025/0126193 | A1* | 4/2025 | Tong | H04M 1/02 |

FOREIGN PATENT DOCUMENTS

| | | | |
|---|---|---|---|
| CN | 216532240 | U | 5/2022 |
| CN | 114630494 | A | 6/2022 |
| CN | 115110235 | A | 9/2022 |
| TW | 201016107 | A | 4/2010 |

* cited by examiner

CONNECTION STRUCTURE AND ELECTRONIC DEVICE

CROSS-REFERENCE TO RELATED APPLICATIONS

This application is a national stage of International Application No. PCT/CN2023/125285, filed on Oct. 18, 2023, which claims priority to Chinese Patent Application No. 202211511521.4, filed on Nov. 29, 2022, and Chinese Patent Application No. 202310204554.2, filed Feb. 24, 2023. The disclosures of all of the aforementioned applications are hereby incorporated by reference in their entireties.

TECHNICAL FIELD

Embodiments of this application relate to the field of terminal technologies, and in particular, to a connection structure and an electronic device.

BACKGROUND

Currently, electronic devices such as computers and mobile phones have become inseparable from our lives, are seen everywhere in our lives, and greatly improve living standards of people.

To implement a function required by a user, it is usually necessary to implement an electrical connection in the electronic device through structural design matching. For example, a near field communication (NFC) technology-based coil module is electrically connected to a circuit board by elastically connecting a spring sheet. An antenna functional spring sheet on the circuit board is electrically connected to a middle frame by riveting a metal member. A display is electrically connected to the middle frame by welding a metal sheet and by using conductive foam. In many electrical connection solutions, it is a common way to implement an electrical connection between a plurality of structural members by using a screw connection.

However, in a process in which the user uses the electronic device, because of scenarios such as falling, a gap is easily generated between the structural member and the circuit board, which further causes poor contact between the structural member and the circuit board or between the circuit board and the middle frame, resulting in poor performance of the electronic device.

SUMMARY

Embodiments of this application provide a connection structure and an electronic device, which can avoid existence of a gap between a metal structural member and a circuit board in scenarios such as falling, and can further avoid a problem of poor overall performance due to poor contact between the metal structural member and the circuit board or between the circuit board and a middle frame.

According to a first aspect, an embodiment of this application provides an electronic device. The electronic device includes at least a middle frame, a metal structural member, and a fastener; the metal structural member has a first through hole, the middle frame has a second through hole, and the fastener passes through the first through hole and the second through hole; at least one through groove is provided on the metal structural member, a surface of the through groove facing away from the middle frame is recessed, and the through groove extends to at least one outer edge of the metal structural member; and a surface of the through groove facing the middle frame is protruded.

According to the electronic device provided in this embodiment of this application, the fastener can fixedly connect the metal structural member and the middle frame by passing the fastener through the first through hole on the metal structural member and the second through hole on the middle frame. In addition, the at least one through groove is provided on the metal structural member, the surface of the through groove facing away from the middle frame is recessed, the through groove extends to the at least one outer edge of the metal structural member, and the surface of the through groove facing the middle frame is protruded. In this way, the through groove can squeeze the middle frame, to absorb a gap between the metal structural member and the middle frame. Therefore, existence of a gap between the metal structural member and the middle frame in scenarios such as falling can be avoided, and a problem of poor overall performance of the electronic device due to poor contact between the metal structural member and the middle frame can be further avoided.

In a possible implementation, the through groove is formed by using a stamping process. The stamping process has advantages of high production efficiency and low material consumption. Therefore, forming the through groove on the metal structural member by using the stamping process can improve efficiency of producing the through groove, and can fully utilize the metal structural member, thereby avoiding a waste of costs. In addition, the stamping process has relatively high size precision and relatively good processing stability.

In a possible implementation, the through groove is provided close to the first through hole. The through groove is provided at a location close to the first through hole. Because the surface of the through groove facing the middle frame is protruded, at a location of the through groove closer to the first through hole, a groove bottom of the through groove has a better squeezing effect when squeezing the middle frame. In this way, a gap between the metal structural member and the middle frame can be better absorbed, thereby avoiding, to a greater extent, a problem that there is a gap between the metal structural member and the middle frame in scenarios such as falling.

In a possible implementation, a contact surface between the through groove and the middle frame is in a shape of a rectangle or a square ring.

In a possible implementation, at least one convex hull is further disposed on the metal structural member. The at least one convex hull is further disposed on the metal structural member, and a structure of the convex hull can effectively improve impedance of a contact surface between the metal structural member and the middle frame. Specifically, adding the convex hull can change surface contact between the metal structural member and the middle frame to point contact, thereby increasing a pressure of a contact point to destroy an interface of a non-good conductor, increasing a nominal contact area, and reducing impedance. Therefore, by adding the convex hull on a basis of providing the through groove on the metal structural member, a more stable electrical connection can be formed between the metal structural member and the middle frame.

In a possible implementation, a surface of the convex hull facing the middle frame is protruded and a surface of the convex hull facing away from the middle frame is a flat surface.

In a possible implementation, the convex hull is disposed close to the first through hole. The convex hull is disposed at a location close to the first through hole. Because the surface of the convex hull facing the middle frame is protruded, the convex hull can effectively improve impedance of a contact surface between the metal structural member and the middle frame. At a location of the convex hull closer to the first through hole, the convex hull has a better squeezing effect when squeezing the middle frame. In this way, a gap between the metal structural member and the middle frame can be better absorbed, thereby avoiding, to a greater extent, a problem that there is a gap between the metal structural member and the middle frame in scenarios such as falling, and forming a more stable electrical connection between the metal structural member and the middle frame.

In a possible implementation, a contact surface between the convex hull and the middle frame is in a shape of a circle or a circular ring.

In a possible implementation, an end of the metal structural member has a bent edge; and an extension direction of the through groove is parallel to a length direction of the bent edge. By designing the extension direction of the through groove to be parallel to the length direction of the bent edge, the bent edge of the metal structural member is not damaged when the through groove is produced. In addition, the extension direction of the through groove is parallel to the length direction of the bent edge, so that the bent edge of the metal structural member does not interfere with a process of producing the through groove, thereby preventing existence of the bent edge from affecting stability and reliability of the process of producing the through groove.

In a possible implementation, the metal structural member has a notch and the notch is in communication with the first through hole, so that at least one elastic arm is formed on the metal structural member. By providing the notch on the metal structural member, the metal structural member implements disconnection design. Because the metal structural member has the first through hole, and the notch is in communication with the first through hole, at least one end of the metal structural member is suspended, and the end designed to be suspended has relative elasticity, thereby ensuring that the at least one elastic arm is formed on the metal structural member.

In a possible implementation, one of the elastic arm is formed on the metal structural member; and the through groove is located on the elastic arm; or the through groove is located in a region on the metal structural member outside the elastic arm. When the through groove is provided on the metal structural member, regardless of whether the through groove is provided on the elastic arm or the through groove is provided in the region on the metal structural member except the elastic arm, as long as the surface of the through groove facing the middle frame is protruded, the groove bottom of the through groove can squeeze the middle frame, so that a gap between the metal structural member and the middle frame can be well absorbed, thereby avoiding, to a great extent, a problem that there is a gap between the metal structural member and the middle frame in scenarios such as falling.

In a possible implementation, the metal structural member includes a first part; and the first part has a first end and a second end that are opposite to each other, and the second end serves as the elastic arm. In this case, a metal structural member having one elastic arm forms a two-claw metal structural member.

In a possible implementation, the metal structural member further includes a second part; and one end of the second part is connected to the first end of the first part. In this case, the end of the second part is connected to the first end of the first part, and a metal structural member having one elastic arm forms a three-claw metal structural member.

In a possible implementation, the metal structural member further includes a third part; and the other end of the second part is connected to the third part. In this case, the end of the second part is connected to the first end of the first part, the other end of the second part is connected to an end of the third part, and a metal structural member having one elastic arm forms a four-claw metal structural member.

In a possible implementation, the electronic device further includes a circuit board, the circuit board is located between the metal structural member and the middle frame; and the at least one through groove is located on a surface of the metal structural member facing away from the circuit board, and a surface of the through groove facing the circuit board is protruded.

When there is the circuit board between the metal structural member and the middle frame, the at least one through groove is provided on the metal structural member, and the through groove is also located on the surface of the metal structural member facing away from the circuit board. In this case, the surface of the through groove facing the circuit board is protruded, and the groove bottom of the through groove can squeeze the circuit board, to absorb a gap between the metal structural member and the circuit board. Therefore, existence of a gap between the metal structural member and the circuit board in scenarios such as falling can be avoided, and a problem of poor overall performance of the electronic device due to poor contact between the metal structural member and the circuit board or between the circuit board and the middle frame can be further avoided.

According to a second aspect, an embodiment of this application provides a connection structure, applied to an electronic device. The electronic device includes a middle frame and a metal structural member, the metal structural member has a first connection part, and the middle frame has a second connection part; the connection structure includes at least the first connection part, the second connection part, and a fastener; and the first connection part has a first through hole, the second connection part has a second through hole, and the fastener passes through the first through hole and the second through hole; and at least one through groove is provided on the first connection part, a surface of the through groove facing away from the second connection part is recessed, and the through groove extends to at least one outer edge of the first connection part; and a surface of the through groove facing the second connection part is protruded.

According to the connection structure provided in this embodiment of this application, the connection structure includes the first connection part of the metal structural member, the second connection part of the middle frame, and the fastener. By passing the fastener through the first through hole on the first connection part and the second through hole on the second connection part, the fastener can fixedly connect the first connection part and the second connection part, so that the metal structural member and the middle frame are fixedly connected. In addition, the at least one through groove is provided on the first connection part of the metal structural member, the surface of the through groove facing away from the second connection part of the middle frame is recessed, and the surface of the through groove facing the second connection part of the middle frame is protruded, so that a groove bottom of the through groove can squeeze the middle frame, to absorb a gap between the metal structural member and the middle frame. Therefore, existence of a gap between the metal structural member and the middle frame in scenarios such as falling can be avoided, and a problem of poor overall performance of the electronic device due to poor contact between the metal structural member and the middle frame can be further avoided.

In a possible implementation, the through groove is formed by using a stamping process. The stamping process has advantages of high production efficiency and low material consumption. Therefore, forming the through groove on the metal structural member by using the stamping process can improve efficiency of producing the through groove, and can fully utilize the metal structural member, thereby avoiding a waste of costs. In addition, the stamping process has relatively high size precision and relatively good processing stability.

In a possible implementation, the through groove is provided close to the first through hole. The through groove is provided at a location close to the first through hole. Because the surface of the through groove facing the middle frame is protruded, at a location of the through groove closer to the first through hole, the groove bottom of the through groove has a better squeezing effect when squeezing the middle frame. In this way, a gap between the metal structural member and the middle frame can be better absorbed, thereby avoiding, to a greater extent, a problem that there is a gap between the metal structural member and the middle frame in scenarios such as falling.

In a possible implementation, at least one convex hull is further disposed on the first connection part. A structure of the convex hull can effectively improve impedance of a contact surface between the metal structural member and the middle frame. Specifically, adding the convex hull can change surface contact between the metal structural member and the middle frame to point contact, thereby increasing a pressure of a contact point to destroy an interface of a non-good conductor, increasing a nominal contact area, and reducing impedance. Therefore, by adding the convex hull on a basis of providing the through groove on the metal structural member, a more stable electrical connection can be formed between the metal structural member and the middle frame.

In a possible implementation, the surface of the convex hull facing the second connection part is protruded, and a surface of the convex hull facing away from the second connection part is a flat surface.

In a possible implementation, the convex hull is disposed close to the first through hole. Because the surface of the convex hull facing the middle frame is protruded, the convex hull can effectively improve impedance of a contact surface between the metal structural member and the middle frame. At a location of the convex hull closer to the first through hole, the convex hull has a better squeezing effect when squeezing the middle frame. In this way, a gap between the metal structural member and the middle frame can be better absorbed, thereby avoiding, to a greater extent, a problem that there is a gap between the metal structural member and the middle frame in scenarios such as falling, and forming a more stable electrical connection between the metal structural member and the middle frame.

In a possible implementation, an end of the first connection part has a bent edge; and an extension direction of the through groove is parallel to a length direction of the bent edge. By designing the extension direction of the through groove to be parallel to the length direction of the bent edge, the bent edge of the metal structural member is not damaged when the through groove is produced. In addition, the extension direction of the through groove is parallel to the length direction of the bent edge, so that the bent edge of the metal structural member does not interfere with a process of producing the through groove, thereby preventing existence of the bent edge from affecting stability and reliability of the process of producing the through groove.

In a possible implementation, the first connection part has a notch, and the notch is in communication with the first through hole, so that at least one elastic arm is formed on the first connection part; and the through groove is located on the elastic arm; or the through groove is located in a region on the first connection part outside the elastic arm. By providing the notch on the first connection part of the metal structural member, the first connection part implements disconnection design. Because the first connection part has the first through hole, and the notch is in communication with the first through hole, at least one end of the first connection part is suspended, and the end designed to be suspended has relative elasticity, thereby ensuring that the at least one elastic arm is formed on the first connection part.

In addition, when the through groove is provided on the first connection part, regardless of whether the through groove is provided on the elastic arm or the through groove is provided in the region on the metal structural member except the elastic arm, as long as the surface of the through groove facing the middle frame is protruded, the groove bottom of the through groove can squeeze the middle frame, so that a gap between the metal structural member and the middle frame can be well absorbed, thereby avoiding, to a great extent, a problem that there is a gap between the metal structural member and the middle frame in scenarios such as falling.

DESCRIPTIONS OF REFERENCE NUMERALS

100—connection structure; 110—metal structural member; 110*a*—first connection part;

110*b*—main body part; 111—first through hole; 112—through groove;

1121—groove surface of a through groove; 1122—groove bottom of the through groove; **112*a***—first through groove;

**1121*a*—groove surface of the first through groove; 1122*a*—groove bottom of the first through groove; 112*b***—second through groove;

**1121*b*—groove surface of the second through groove; 1122*b*—groove bottom of the second through groove; 112*c***—third through groove;

**1121*c*—groove surface of the third through groove; 1122*c*—groove bottom of the third through groove; 112*d***—fourth through groove;

**1121*d*—groove surface of the fourth through groove; 1122*d*—groove bottom of the fourth through groove; 113**—bent edge;

114—notch; 115—elastic arm; 1101—first part;

**1101*a*—first end of the first part; 1101*b*—second end of the first part; 1102**—second part;

**1102*a*—first end of the second part; 1102*b*—second end of the second part; 1103**—third part;

**1103*a*—first end of the third part; 1103*b*—second end of the third part; 116**—convex hull;

1161—first surface of the convex hull; 1162—second surface of the convex hull; 120—fastener;

130—plastic structural member; 200—electronic device; 210—display;

220—middle frame; 221—middle plate; 222—side frame;

2201—second through hole; **2201*a*—second connection part; 230**—circuit board;

2301—third through hole; 240—battery; 250—USB interface;

260—card tray; 270—motor; L1—extension direction of the through groove;

L2—length direction of the bent edge; S1—first flat surface; S2—second flat surface.

DESCRIPTION OF EMBODIMENTS

Terms used in the implementation part of this application are merely intended to explain specific embodiments of this application, and are not intended to limit this application. Implementations of the embodiments of this application are described in detail below with reference to the accompanying drawings.

Electronic devices such as computers and mobile phones have become inseparable from our lives, are seen everywhere in our lives, and greatly improve living standards of people.

An embodiment of this application provides an electronic device, and the electronic device may include, but is not limited to, a mobile or fixed terminal that has a connection structure or requires an electrical connection, for example, a mobile phone, a tablet computer, a notebook computer, an ultra-mobile personal computer (UMPC), a handheld computer, a walkie-talkie, a netbook, a point of sales (POS), a personal digital assistant (PDA), a wearable device, a virtual reality device, a wireless USB flash drive, a Bluetooth speaker/headset, a factory-installed vehicle component, an event data recorder, or a security device.

Figure 1:
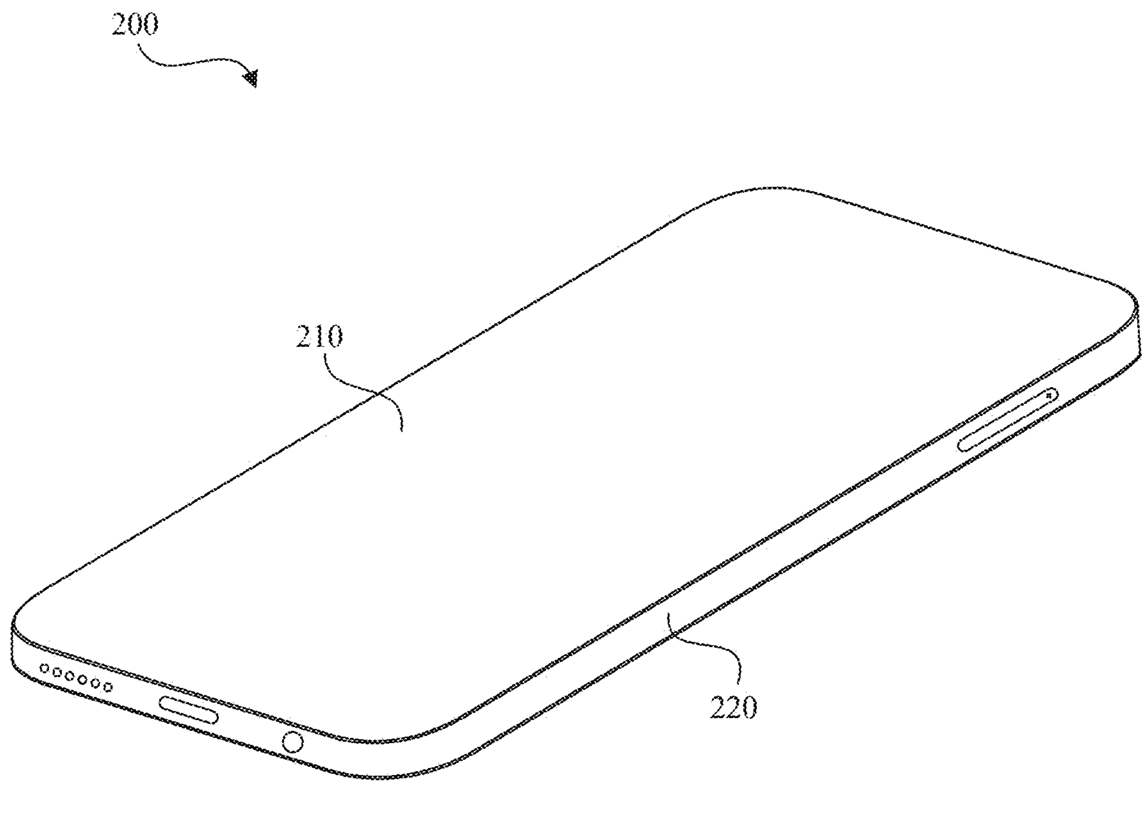
FIG. 1 is a schematic diagram of a three-dimensional structure of an electronic device according to an embodiment of this application.
Figure 2:
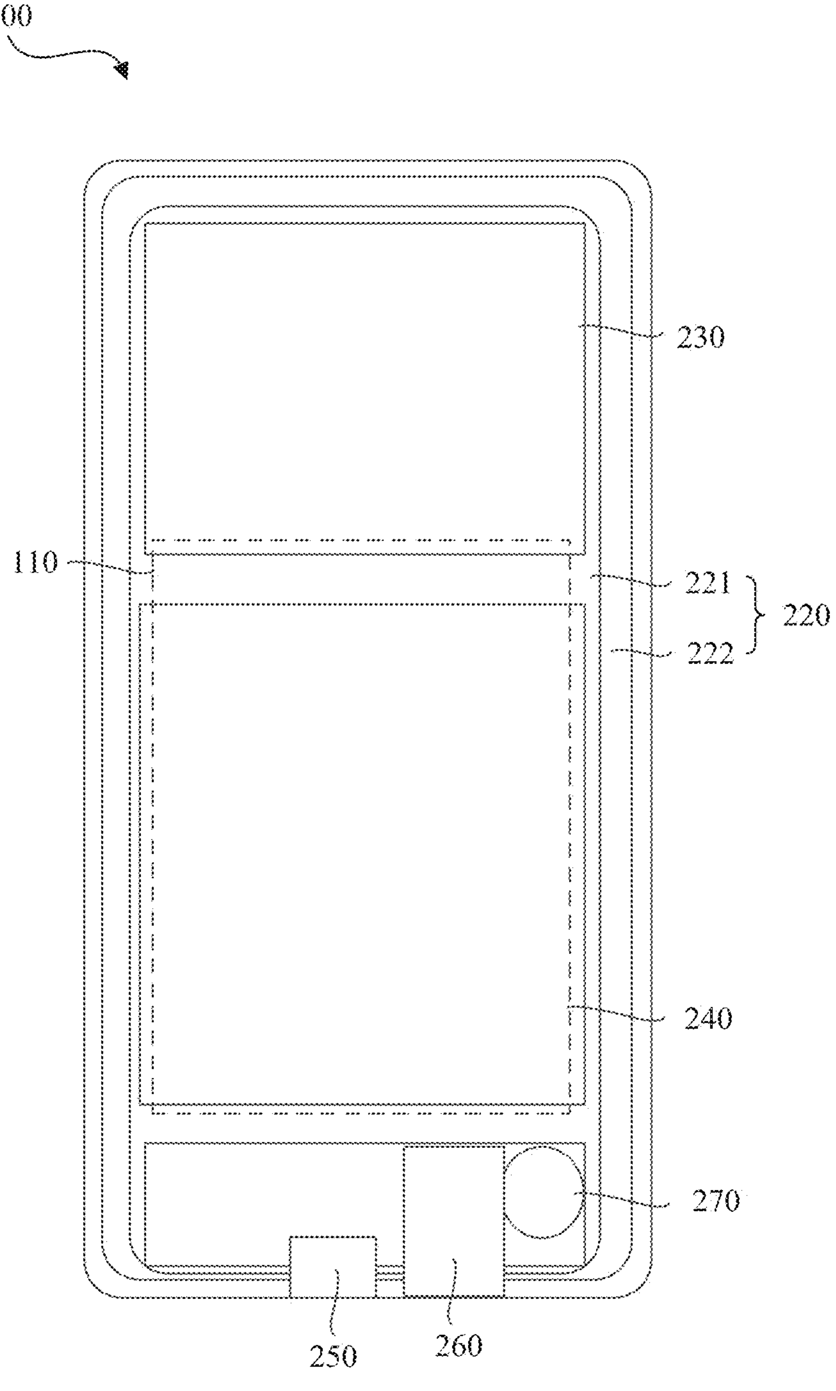
FIG. 2 is a schematic diagram of a planar structure of an electronic device according to an embodiment of this application.

An example in which the foregoing electronic device is a mobile phone is used for description. The mobile phone provided in this embodiment of this application may be a curved-screen mobile phone or a flat-screen mobile phone. In this embodiment of this application, the flat-screen mobile phone is used as an example for description. FIG. 1 and FIG. 2 respectively show an overall three-dimensional structure and a planar structure of an electronic device. Referring to FIG. 1 and FIG. 2, an electronic device 200 provided in this embodiment of this application may include at least a display 210, a middle frame 220, a circuit board 230, a battery 240, and a rear cover (not shown in the figure). The middle frame 220, the circuit board 230, and the battery 240 are located between the display 210 and the rear cover. The battery 240 may usually have an interface (not shown in the figure) of the battery 240, and the interface of the battery 240 is electrically connected to the circuit board 230.

The circuit board 230 may be disposed on the middle frame 220. For example, the circuit board 230 may be disposed on a surface of the middle frame 220 facing the rear cover, or the circuit board 230 may be disposed on a surface of the middle frame 220 facing the display 210. Similarly, the battery 240 may be disposed on the surface of the middle frame 220 facing the rear cover, or the battery 240 may be disposed on the surface of the middle frame 220 facing the display 210. For example, the surface of the middle frame 220 facing the rear cover may have a compartment (not shown in the figure) of the battery 240, and the battery 240 may be mounted in the compartment of the battery 240.

The battery 240 may be connected to a charging management module and the circuit board 230 by using a power management module. The power management module receives an input of the battery 240 and/or an input of the charging management module, and supplies power to a processor, an internal memory, an external memory, the display 210, a camera module, a communication module, and the like. The power management module may be further configured to monitor parameters such as a capacity of the battery 240, a cycle count of the battery 240, and a state of health (leakage or impedance) of the battery 240. In some other embodiments, the power management module may alternatively be disposed in the processor of the circuit board 230. In some other embodiments, the power management module and the charging management module may alternatively be disposed in a same component.

When the electronic device 200 is a flat-screen electronic device 200, the display 210 may be an organic light-emitting diode (OLED) display 210, or may be a liquid crystal display (LCD) 210. When the electronic device 200 is a curved-screen electronic device 200, the display 210 may be an OLED display 210.

Still referring to FIG. 2, the middle frame 220 may include a middle plate 221 and a side frame 222, and the side frame 222 may be disposed around a periphery of the middle plate 221 for one circle. Usually, the side frame 222 may include a top edge, a bottom edge, a left edge, and a right edge, and the side frame 222 having a square ring structure is enclosed by the top edge, the bottom edge, the left edge, and the right edge. A material of the middle plate 221 may include but is not limited to an aluminum plate, an aluminum alloy, stainless steel, a steel-aluminum composite die-casting plate, a titanium alloy, or a magnesium alloy. For example, in some embodiments, the material of the middle plate 221 may be plastic or the like. Specifically, the middle frame 220 is a relatively complex structure in actual product design. It is merely said that the middle frame 220 is usually spatially divided into the circumferential side frame 222 and the region middle plate 221 that needs to accommodate a main board, a sub-board, the battery 240, or the like. Therefore, distribution of a material of the middle frame 220 is not necessarily complete. For example, the battery compartment is usually made of metal, but may alternatively be made of plastic only in consideration of impact of some other factors.

The side frame 222 may be a metal side frame 222 or a plastic side frame 222, may be a ceramic side frame 222, or may be a glass side frame 222. When the side frame 222 is a metal side frame 222, a material of the metal side frame 222 may include but is not limited to an aluminum alloy, stainless steel, a steel-aluminum composite die-casting plate, a titanium alloy, or the like. The middle plate 221 may be connected to the side frame 222 through clamping, welding, bonding, or integral molding, or the middle plate 221 may be fixedly connected to the side frame 222 through injection molding.

The rear cover may be a metal rear cover, may be a glass rear cover, may be a plastic rear cover, or may be a ceramic rear cover. In this embodiment of this application, a material of the rear cover is not limited, and the foregoing example imposes no limitation.

It should be noted that, in some examples, the rear cover of the electronic device 200 may be connected to the side frame 222 to form a unibody rear cover. For example, the electronic device 200 may include the display 210, the middle plate 221, and a battery cover. The battery cover may be the unibody rear cover formed by the side frame 222 and the rear cover. In this way, the circuit board 230 and the battery 240 are located in space enclosed by the middle plate 221 and the battery cover.

In this embodiment of this application, as shown in FIG. 2, the electronic device 200 may further include a USB interface 250, a card tray 260, and a motor 270. In addition, the USB interface 250, the card tray 260, and the motor 270 are usually disposed at a bottom end of the electronic device 200, namely, a location relatively close to the bottom edge of the side frame 222.

It may be understood that the structure shown in this embodiment of this application constitutes no specific limitation on the electronic device 200. In some other embodiments of this application, the electronic device 200 may include more or fewer parts than those shown in the figure, some parts may be combined, some parts may be split, or there may be different part arrangements. For example, the electronic device 200 may further include components such as a camera (for example, a front-facing camera and a rear-facing camera) and a flash light.

In addition, to implement a function required by a user, the electronic device 200 inevitably needs to implement an electrical connection in the electronic device 200 through structural design matching. For example, a near field communication (NFC) technology-based coil module is connected to the circuit board 230 by elastically connecting a spring sheet. An antenna functional spring sheet on the circuit board 230 is connected to the middle frame 220 by riveting a metal member with the middle frame 220. The display 210 is connected to the middle frame 220 by using conductive foam and by welding a metal sheet.

Figure 3:
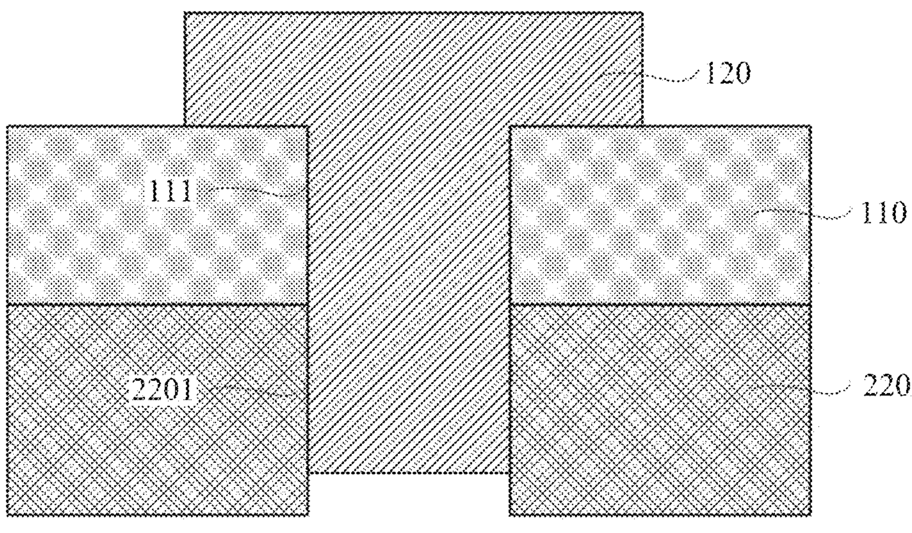
FIG. 3 is a schematic diagram of a cross section of a connection structure in an electronic device in the conventional technology.
Figure 4:
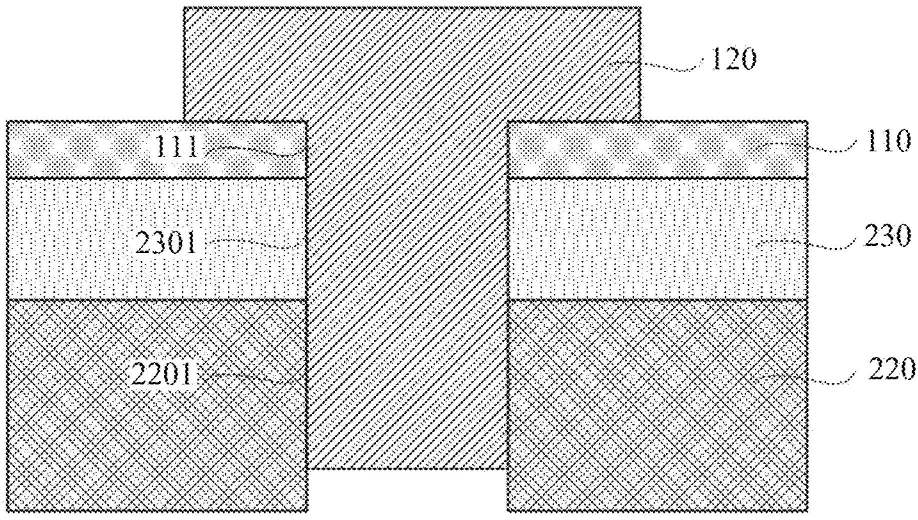
FIG. 4 is a schematic diagram of another cross section of a connection structure in an electronic device in the conventional technology.

In many electrical connection solutions, it is a common way to implement an electrical connection between a plurality of structural members in a screw manner. For example, in FIG. 3, a metal structural member 110 is connected to the middle frame 220 by using a fastener 120. Specifically, the metal structural member 110 has a first through hole 111, the middle frame 220 has a second through hole 2201, and the fastener 120 passes through the first through hole 111 and the second through hole 2201 to fasten the metal structural member 110 and the middle frame 220. In FIG. 4, the metal structural member 110 is connected to the middle frame 220 and the circuit board 230 by using the fastener 120. Specifically, the metal structural member 110 has the first through hole 111, the middle frame 220 has the second through hole 2201, and the circuit board 230 has a third through hole 2301. The fastener 120 passes through the first through hole 111, the second through hole 2201, and the third through hole 2301 to fasten the metal structural member 110, the middle frame 220, and the circuit board 230. However, in a process in which the user uses the electronic device 200, because of scenarios such as falling, a gap is easily generated between the metal structural member 110 and the circuit board 230, which further causes poor contact between the metal structural member 110 and the circuit board 230 or between the circuit board 230 and the middle frame 220, resulting in poor use performance of the electronic device 200.

In this embodiment of this application, an electrical connection location may usually be a region of the circuit board 230. Specifically, a structural member, the circuit board 230, and the middle frame 220 may be locked together to implement an electrical connection. In this scenario, the structural member may be a metal structural member, to enhance contact between the structural member and the circuit board 230. Alternatively, the structural member may be a gasket welded below the circuit board 230, and in this case, the gasket serves as a metal structural member, to enhance contact between the gasket and the middle frame 220. Alternatively, in a non-board sub-region (namely, a region outside the circuit board 230), for example, a speaker component region, there may be a situation in which a speaker component and the middle frame 220 are locked together. In most cases, the speaker component is a metal-plastic composite structural member, and a metal part serves as the metal structural member in this embodiment of this application. Then, it is equivalent to enhancing reliability of a connection between the speaker component and the middle frame 220.

Figure 5:
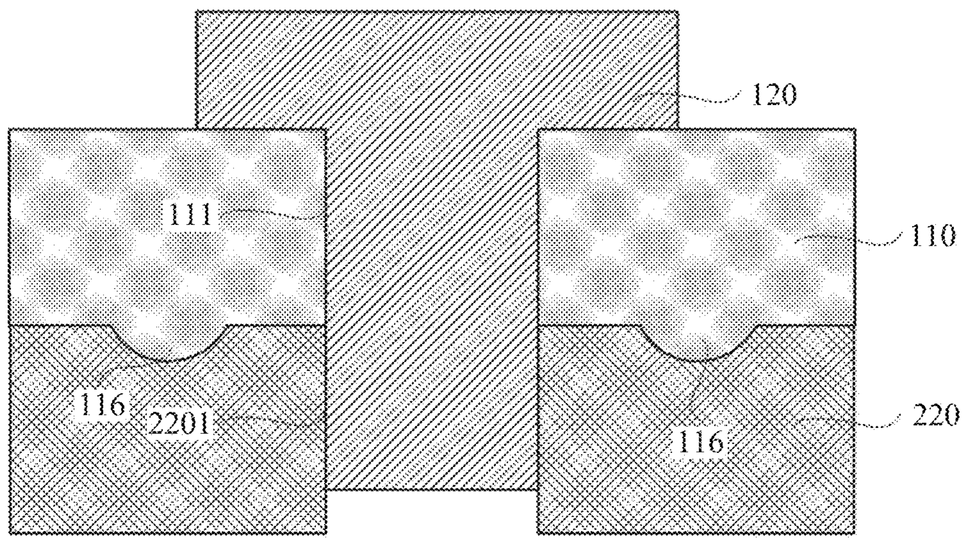
FIG. 5 is a schematic diagram of still another cross section of a connection structure in an electronic device in the conventional technology.
Figure 6:
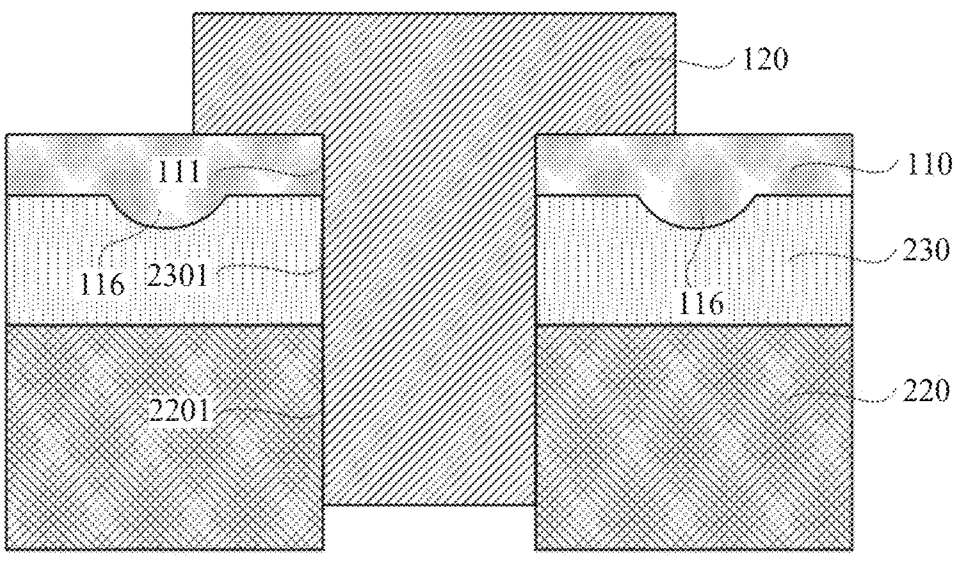
FIG. 6 is a schematic diagram of yet another cross section of a connection structure in an electronic device in the conventional technology.

In a related technology, to improve reliability of an electrical connection after a reliability test, such as falling, a convex hull 116 (as shown in FIG. 5 and FIG. 6) is usually added between two contact surfaces (for example, between the metal structural member and the middle frame 220 or between the metal structural member and the circuit board 230) in actual design, to absorb a floating height when the fastener is fastened (for example, a screw is screwed) or a gap between contact surfaces. In addition, a structure of the convex hull 116 effectively improves impedance of the contact surface, mainly by changing surface contact to point contact, increasing a pressure of a contact point to destroy an interface of a non-good conductor, and increasing a nominal contact area. This reduces impedance, to form a more stable electrical connection.

However, for point-to-surface contact, it is necessary to ensure that the convex hull 116 has a complete contact surface in consideration of a tolerance reason in whole machine processing. Usually, a height of the convex hull 116 needs to be 0.08±0.02 mm, and a distance from a center of the convex hull 116 to an edge of the contact surface is more than 0.6 mm on one side. Because the convex hull 116 is in a combination scenario of a screw and the convex hull 116, in some architectures, for example, when the structural member is in limited XY space (namely, not in a thickness direction of the electronic device 200), it is difficult to mold the complete convex hull 116, and it is impossible to ensure that the convex hull 116 has an enough effective contact area. If the sufficient contact area cannot be ensured, when the contact point enters a high resistance region, an uncontrollable electrical connection problem occurs in the point-to-surface contact, or even a fatal RSE regulatory issue is presented in a high current region.

Based on this, an embodiment of this application provides a new connection structure and an electronic device having the connection structure, and the connection structure is applied to the electronic device. The electronic device includes at least a middle frame, a metal structural member, and a fastener; the metal structural member has a first through hole, the middle frame has a second through hole, and the fastener passes through the first through hole and the second through hole, to fasten the metal structural member and the middle frame; at least one through groove is provided on the metal structural member, a surface of the through groove facing away from the middle frame is recessed, and the through groove extends to at least one outer edge of the metal structural member; and a surface of a groove bottom of the through groove facing the middle frame is protruded. In this way, existence of a gap between the metal structural member and the middle frame in scenarios such as falling can be avoided, and a problem of poor overall performance of the electronic device due to poor contact between the metal structural member and the middle frame can be further avoided.

The following uses specific embodiments as an example to describe the connection structure and a specific structure of the electronic device with reference to the accompanying drawings.

Figure 7:
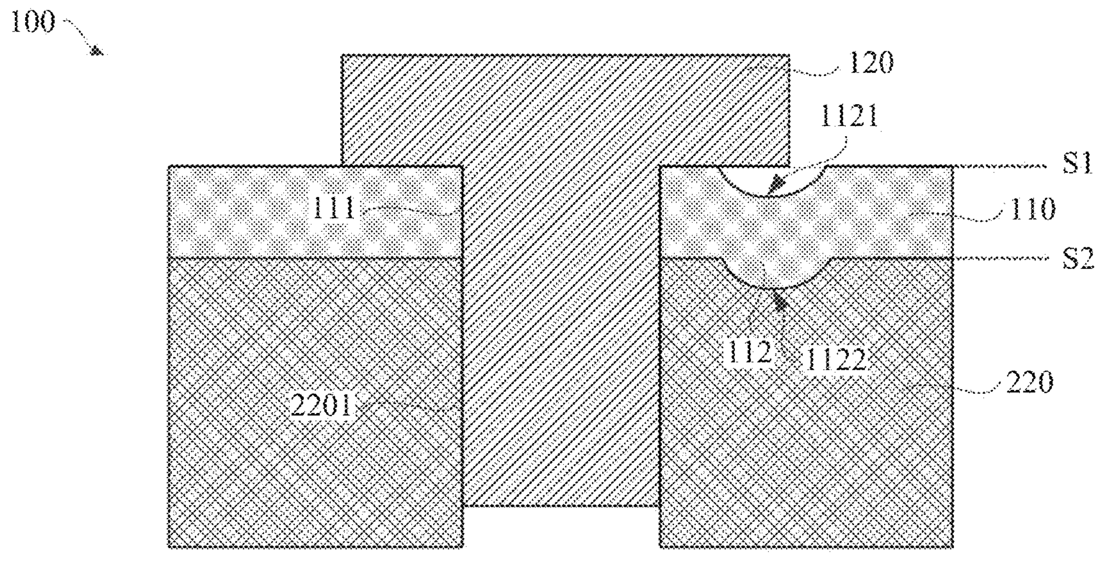
FIG. 7 is a schematic diagram of a cross section of a connection structure in an electronic device according to an embodiment of this application.
Figure 8:
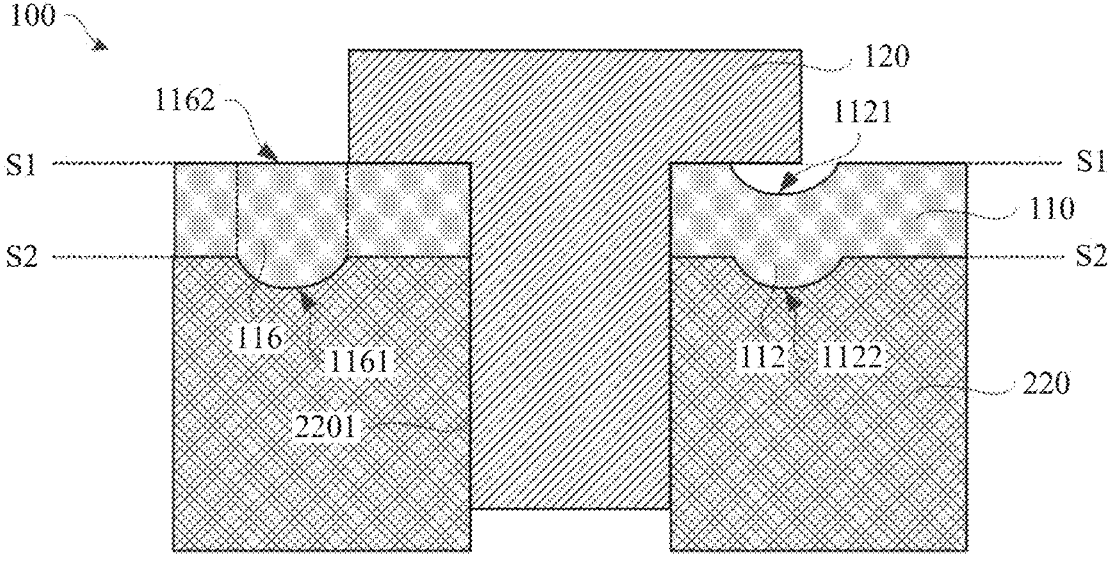
FIG. 8 is a schematic diagram of a cross section of a connection structure in an electronic device according to an embodiment of this application.
Figure 9:
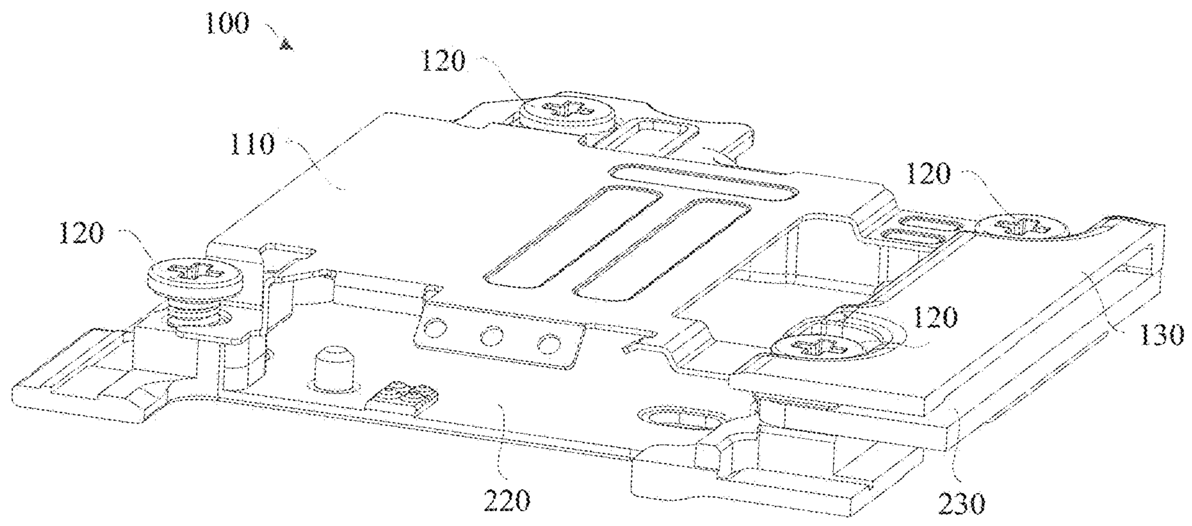
FIG. 9 is a schematic diagram of a three-dimensional structure of a connection structure in an electronic device according to an embodiment of this application.
Figure 10:
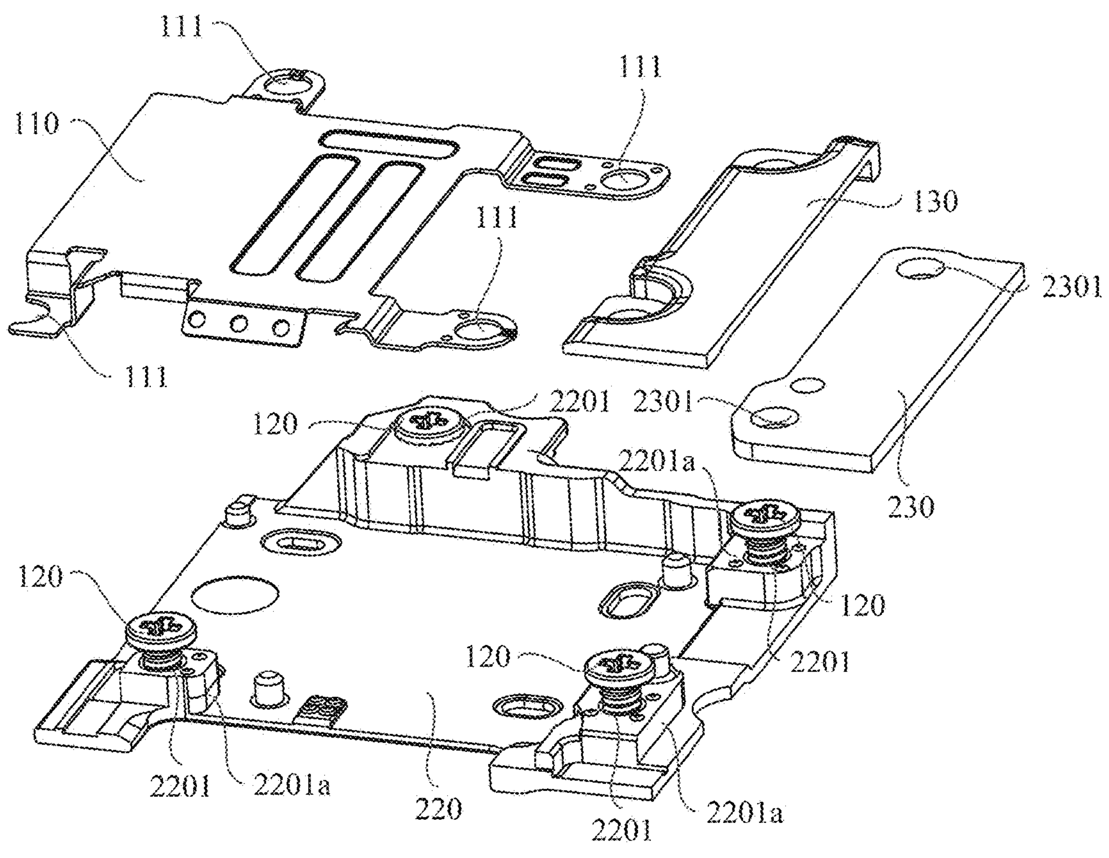
FIG. 10 is an exploded view of FIG. 9.

Referring to FIG. 7 to FIG. 9, an embodiment of this application provides an electronic device 200. The electronic device 200 may include at least a middle frame 220, a metal structural member 110, and a fastener 120. As shown in FIG. 10, the metal structural member 110 has a first through hole 111, the middle frame 220 has a second through hole 2201, and the fastener 120 passes through the first through hole 111 and the second through hole 2201, to fasten the metal structural member 110 and the middle frame 220.

At least one through groove 112 is provided on the metal structural member 110, a surface of the through groove 112 facing away from the middle frame 220 is recessed, and a surface of the through groove 112 facing the middle frame 220 is protruded.

Referring to FIG. 7 or FIG. 8, the through groove 112 has a groove surface (namely, a groove surface 1121 of the through groove) and a groove bottom (namely, a groove bottom 1122 of the through groove), the groove surface 1121 of the through groove is recessed, and the groove bottom 1122 of the through groove is protruded. Specifically, for example, a region on a surface of the metal structural member 110 facing away from the middle frame 220 except the through groove 112 is a first flat surface S1, and a region on a surface of the metal structural member 110 facing the middle frame 220 except the through groove 112 is a second flat surface S2. The groove surface 1121 of the through groove is recessed relative to the first flat surface S1, and the groove bottom 1122 of the through groove is protruded relative to the second flat surface S2.

It may be understood that, in this embodiment of this application, the through groove 112 may extend to at least one outer edge of the metal structural member 110. For example, the through groove 112 may extend to one outer edge of the metal structural member 110, or the through groove 112 may extend to two outer edges of the metal structural member 110, or the through groove 112 may extend to three outer edges of the metal structural member 110. A specific disposing location of the through groove 112 is not limited in this embodiment of this application.

In addition, a quantity of through grooves 112 may be one, two, three, or more. This is not limited in this embodiment of this application.

By passing the fastener 120 through the first through hole 111 on the metal structural member 110 and the second through hole 2201 on the middle frame 220, the fastener 120 can fixedly connect the metal structural member 110 and the middle frame 220. In addition, the at least one through groove 112 is provided on the metal structural member 110, and the surface of the groove bottom 1122 of the through groove facing the middle frame 220 is protruded, so that the groove bottom 1122 of the through groove can squeeze the middle frame 220, to absorb a gap between the metal structural member 110 and the middle frame 220. Therefore, existence of a gap between the metal structural member 110 and the middle frame 220 in scenarios such as falling can be avoided, and a problem of poor overall performance of the electronic device 200 due to poor contact between the metal structural member 110 and the middle frame 220 can be further avoided.

In some embodiments, the first through hole 111 may not be provided on the metal structural member 110, but the first through hole 111 is replaced with a blind hole (not shown in the figure). In this case, the fastener 120 passes through the second through hole 2201 on the middle frame, and an end of the fastener 120 abuts against an inner wall of the blind hole, to fasten the metal structural member 110 and the middle frame 220. In addition, it should be noted that, to implement waste discharge and some space constraints of the electronic device 200, a through hole (for example, the second through hole 2201) is usually provided on the middle frame 220, and the blind hole is not provided.

Figure 11:
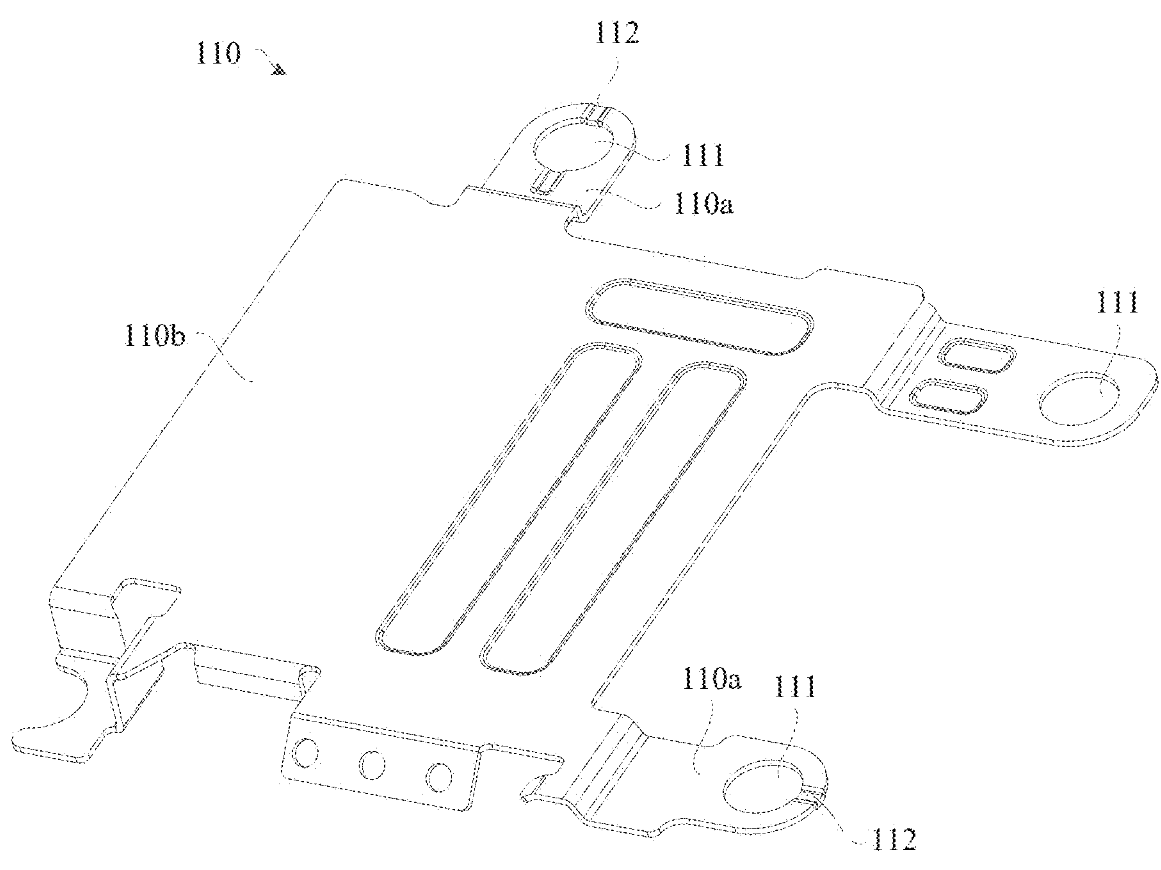
FIG. 11 is a schematic diagram of a three-dimensional structure of a connection structure in an electronic device according to an embodiment of this application.

In this embodiment of this application, the metal structural member 110 may include a main body part **110*b* and at least one first connection part 110*a*. As shown in FIG. 11, the metal structural member 110 includes the main body part 110*b* and three first connection parts 110*a*, and each first connection part 110*a* has the first through hole 111. The middle frame 220 may have a second connection part 2201*a*, and the second connection part 2201*a* has the second through hole 2201**.

An embodiment of this application further provides a connection structure 100. The connection structure 100 is applied to the electronic device 200. The connection structure 100 includes at least a first connection part **110*a* of a metal structural member 110, a second connection part 2201*a* of a middle frame 220, and a fastener 120. The fastener 120 passes through a first through hole 111 and a second through hole 2201, to fasten the first connection part 110*a* and the second connection part 2201*a*, to fixedly connect the metal structural member 110 and the middle frame 220**.

Specifically, in the connection structure 100, at least one through groove 112 is provided on a surface of the first connection part **110*a* facing away from the second connection part 2201*a*, and a surface of the through groove 112 facing away from the second connection part 2201*a* is recessed. The through groove 112 extends to at least one outer edge of the first connection part 110*a*, and a surface of the through groove 112 facing the second connection part 2201*a*** is protruded.

It should be noted that in this embodiment of this application, when the electronic device 200 includes a circuit board 230, the circuit board 230 is usually located between the metal structural member 110 and the middle frame 220. The at least one through groove 112 is located on a surface of the metal structural member 110 facing away from the circuit board 230, and a surface of a groove bottom 1122 of the through groove facing the circuit board 230 is protruded.

When there is the circuit board 230 between the metal structural member 110 and the middle frame 220, the at least one through groove 112 is provided on the metal structural member 110, and the through groove 112 is also located on the surface of the metal structural member 110 facing away from the circuit board 230. In this case, the surface of the groove bottom 1122 of the through groove facing the circuit board 230 is protruded, so that the groove bottom 1122 of the through groove can squeeze the circuit board 230, to absorb a gap between the metal structural member 110 and the circuit board 230. Therefore, existence of a gap between the metal structural member 110 and the circuit board 230 in scenarios such as falling can be avoided, and a problem of poor overall performance of the electronic device 200 due to poor contact between the metal structural member 110 and the circuit board 230 or between the circuit board 230 and the middle frame 220 can be further avoided.

Specifically, as shown in FIG. 10, the metal structural member 110 has the first through hole 111, the middle frame 220 has the second through hole 2201, the circuit board 230 has a third through hole 2301, and the fastener 120 passes through the first through hole 111, the second through hole 2201, and the third through hole 2301, to fasten the metal structural member 110, the middle frame 220, and the circuit board 230.

It may be understood that, in this embodiment of this application, the through groove 112 may be formed by using a stamping process. The stamping process has advantages of high production efficiency and low material consumption. Therefore, forming the through groove 112 on the metal structural member 110 by using the stamping process can improve efficiency of producing the through groove 112, and can fully utilize the metal structural member 110, thereby avoiding a waste of costs. In addition, the stamping process has relatively high size precision and relatively good processing stability.

At a location of a space limit of the metal structural member 110, for example, when a circumference of the metal structural member 110 is designed to match another module or structural member, a design feature becomes complex, and a height difference may be caused by a bend at a specific location. In this embodiment of this application, the through groove 112 can relatively well adapt to a structural feature, and has a relatively low requirement on a spatial size of the metal structural member 110. Thus, a size requirement of XY space can be reduced by replacing a conventional structure of the convex hull 116 with the through groove 112. In addition, when design of the through groove 112 is adopted, if the metal structural member 110 has no bent edge or only one side of the metal structural member 110 includes the bent edge, effective contact between the metal structural member 110 and the middle frame 220 or between the metal structural member 110 and the circuit board 230 can be implemented by designing symmetrical through grooves 112, and processing difficulty of the through groove 112 can also be reduced.

Figure 12:
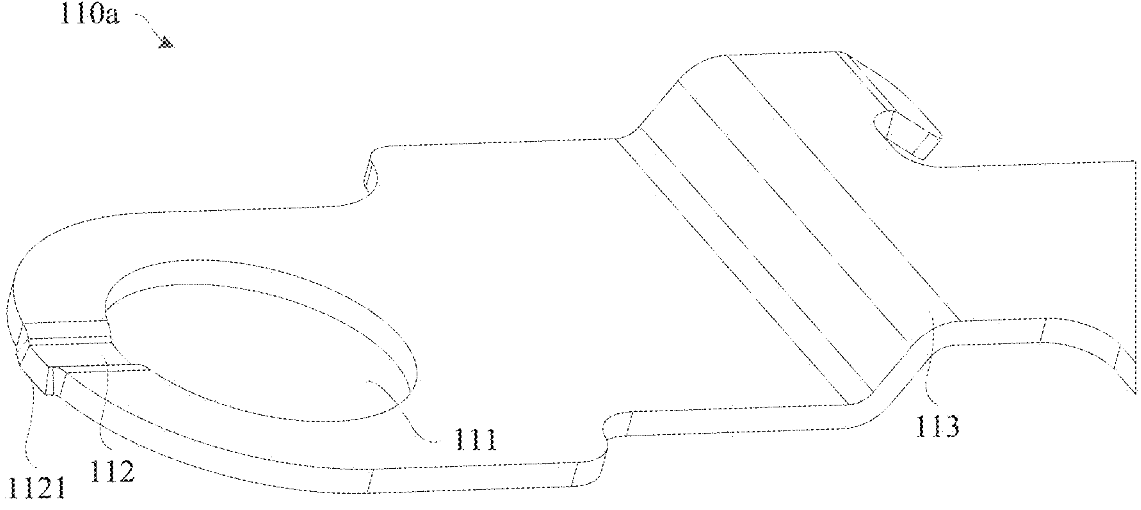
FIG. 12 is a schematic diagram of a front three-dimensional structure of a connection part in the connection structure shown in FIG. 11.
Figure 13:
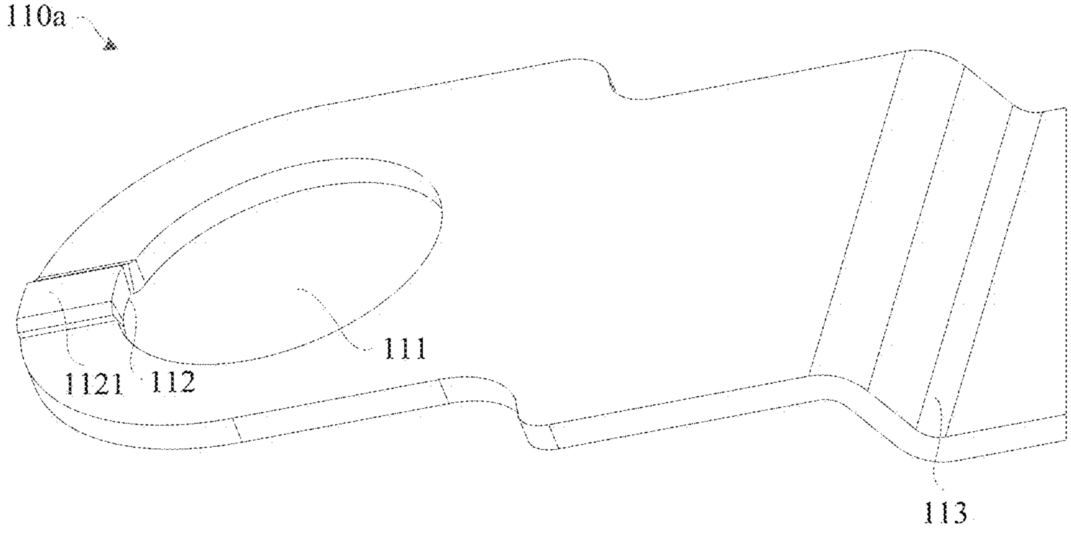
FIG. 13 is a schematic diagram of a rear three-dimensional structure of a connection part in the connection structure shown in FIG. 11.

In this embodiment of this application, referring to FIG. 12 and FIG. 13, the through groove 112 may be a U-shaped groove. Processing difficulty of the U-shaped groove is relatively low, and a process of forming the U-shaped groove by using the stamping process is relatively mature.

As shown in FIG. 12 and FIG. 13, in this embodiment of this application, the through groove 112 may be provided close to the first through hole 111. The fastener 120 needs to pass through the first through hole 111 to implement a connection between the metal structural member 110 and the middle frame 220. The through groove 112 is provided at a location close to the first through hole 111. Because the surface of the groove bottom 1122 of the through groove facing the middle frame 220 is protruded, at a location of the through groove 112 closer to the first through hole 111, the groove bottom 1122 of the through groove has a better squeezing effect when squeezing the middle frame 220. In this way, a gap between the metal structural member 110 and the middle frame 220 can be better absorbed, thereby avoiding, to a greater extent, a problem that there is a gap between the structural member and the circuit board 230 in scenarios such as falling.

Figure 30:
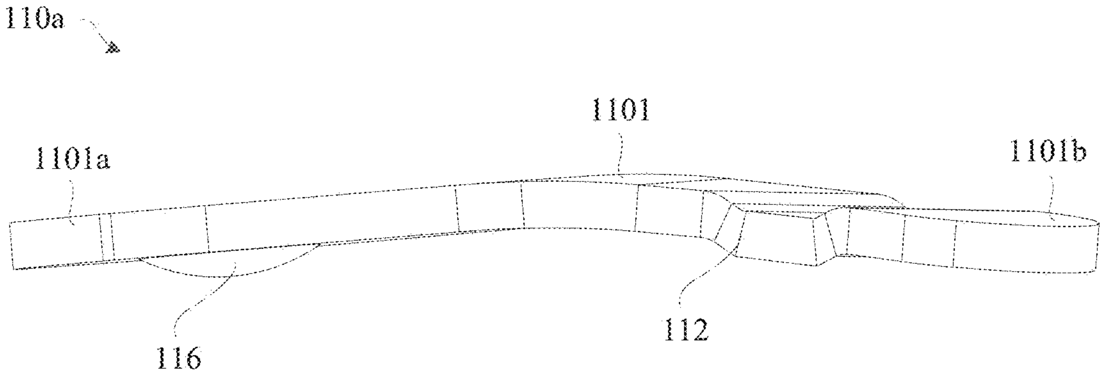
FIG. 30 is a schematic diagram of a side three-dimensional structure in which a through groove is located on an elastic arm when a connection part in a connection structure is a two-claw structure according to an embodiment of this application.

It should be noted that in this embodiment of this application, at least one convex hull 116 may be disposed on the metal structural member 110 (refer to FIG. 8 or FIG. 30).

In a possible implementation, a surface of the convex hull 116 facing the middle frame 220 is protruded, and a surface of the convex hull 116 facing away from the middle frame 220 is a flat surface. The convex hull 116 has a first surface (namely, a first surface 1161 of the convex hull) and a first surface (namely, a second surface 1162 of the convex hull), the first surface 1161 of the convex hull is protruded, and the second surface 1162 of the convex hull is a flat surface.

Specifically, as shown in FIG. 8, for example, a region on a surface of the metal structural member 110 facing away from the middle frame 220 except the through groove 112 and the convex hull 116 is a first flat surface S1, and a region on a surface of the metal structural member 110 facing the middle frame 220 except the through groove 112 and the convex hull 116 is a second flat surface S2. The first surface 1161 of the convex hull is protruded relative to the second flat surface S2, and the second surface 1162 of the convex hull is the flat surface, that is, the second surface 1162 of the convex hull is located on a same plane as the first flat surface S1.

The at least one convex hull 116 is further disposed on the metal structural member 110. The convex hull 116 may be symmetrically disposed with the through groove 112, so that integral structure design of the metal structural member 110 can be as symmetrical as possible. In addition, the structure of the convex hull 116 can effectively improve impedance of a contact surface between the metal structural member 110 and the middle frame 220. Specifically, adding the convex hull 116 can change surface contact between the metal structural member 110 and the middle frame 220 to point contact, thereby increasing a pressure of a contact point to destroy an interface of a non-good conductor, increasing a nominal contact area, and reducing impedance. Therefore, by adding the convex hull 116 on a basis of providing the through groove 112 on the surface of the metal structural member 110 facing the middle frame 220, a more stable electrical connection can be formed between the metal structural member 110 and the middle frame 220.

Certainly, it may be understood that in some embodiments, the convex hull 116 may not be disposed on the metal structural member 110 (as shown in FIG. 7). This is not limited in this embodiment of this application, and is not limited to the foregoing example.

In this embodiment of this application, the convex hull 116 may be disposed close to the first through hole 111. The convex hull 116 is disposed at a location close to the first through hole 111. Because the surface of the convex hull 116 facing the middle frame 220 is protruded, the convex hull 116 can effectively improve impedance of a contact surface between the metal structural member 110 and the middle frame 220. At a location of the convex hull 116 closer to the first through hole 111, the convex hull 116 has a better squeezing effect when squeezing the middle frame 220. In this way, a gap between the metal structural member 110 and the middle frame 220 can be better absorbed, thereby avoiding, to a greater extent, a problem that there is a gap between the structural member and the circuit board 230 in scenarios such as falling, and forming a more stable electrical connection between the metal structural member 110 and the middle frame 220.

Specifically, in an actual application scenario, the convex hull 116 and the through groove 112 may be used together. By using combination design of the through groove 112 and the convex hull 116, a spatial size can be applied more flexibly, and a contact balance can be ensured as much as possible, a quantity and an area of contact points can be increased, and a risk of a contact failure after a reliability scenario is reduced.

Figure 14:
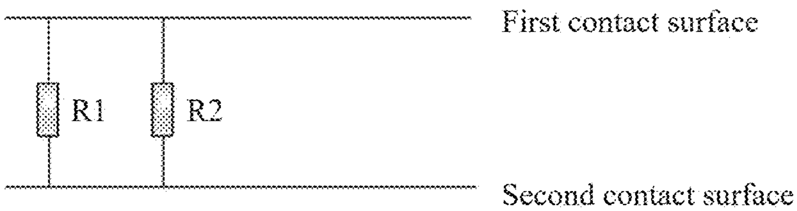
FIG. 14 is a schematic diagram of a principle of a connection structure in contact with a middle frame or a circuit board according to an embodiment of this application.

As shown in FIG. 14, the combination design of the through groove 112 and the convex hull 116 is used. Each contact point is equivalent to connecting one more resistor in parallel, and a resistance value decreases exponentially, helping further reduce system impedance. For example, in a universal serial bus (USB) charging scenario, impedance of a single convex hull 116 is approximately 200 mΩ. To obtain better reflux impedance and improve charging efficiency, the battery 240 group usually requires impedance less than 40 mΩ. In this case, a plurality of points need to be connected in parallel, to further reduce system impedance.

For example, the electronic device 200 includes the circuit board 230. To ensure that in a process of assembling or using the electronic device 200, the metal structural member 110 is in a balanced state compared with the circuit board 230, the convex hull 116 and the through groove 112 need to be evenly arranged. In this case, at a location at which space is sufficient in an XY direction, contact between the metal structural member 110 and the circuit board 230 can be increased by using the convex hull 116 or the through groove 112. At a location at which space is insufficient in the XY direction, contact between the metal structural member 110 and the circuit board 230 can be increased by using the through groove 112.

For example, in this embodiment of this application, when the surface of the convex hull 116 facing the circuit board 230 and the surface of the through groove 112 facing the circuit board 230 are protruded, the convex hull 116 and the through groove 112 may be protruded by 0.05 mm relative to the second flat surface S2 of the metal structural member 110, and a protruding contact area may be approximately 0.2 $mm^2$. It should be noted that a specific area is not limited in this embodiment of this application, and is not limited to the foregoing example.

In addition, structures of the convex hull 116 and the through groove 112 are compared herein. The convex hull 116 is usually a ball-head convex hull, a nominal contact surface of point contact of the ball-head convex hull is annular, and a length of the annular contact surface in each direction is consistent. If a diameter of the ball-head convex hull is large, a problem of a contact failure can be resolved to some extent. However, because of an increase in a size in each direction, more space is lost. Even if an elliptical cross-sectional structure is used, an area cannot be effectively reduced due to a need to reserve a skirt edge (namely, an edge location around the ball-head convex hull) and a limitation on an original size of the metal structural member 110. If a circumference size of the ball-head convex hull is further reduced, and a height remains unchanged, structural strength of the metal structural member 110 is affected, causing the structure of the convex hull 116 to fall off.

A nominal contact surface of the through groove 112 is a rectangle, and may be relatively long in a single direction without affecting a design size of another edge. In addition, the through groove 112 does not need to reserve a skirt edge (that is, there is no edge location around the through groove 112), so that a size of the metal structural member 110 can be further reduced.

Figure 15:
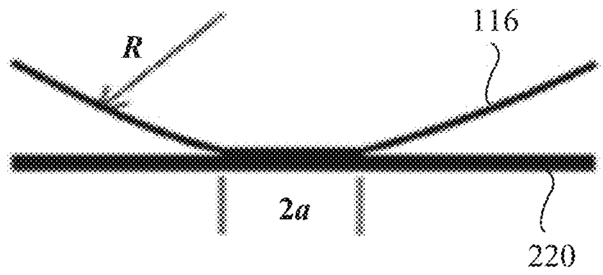
FIG. 15 is a schematic diagram of a structure when a convex hull in a connection structure is in contact with a middle frame or a circuit board according to an embodiment of this application.
Figure 16:
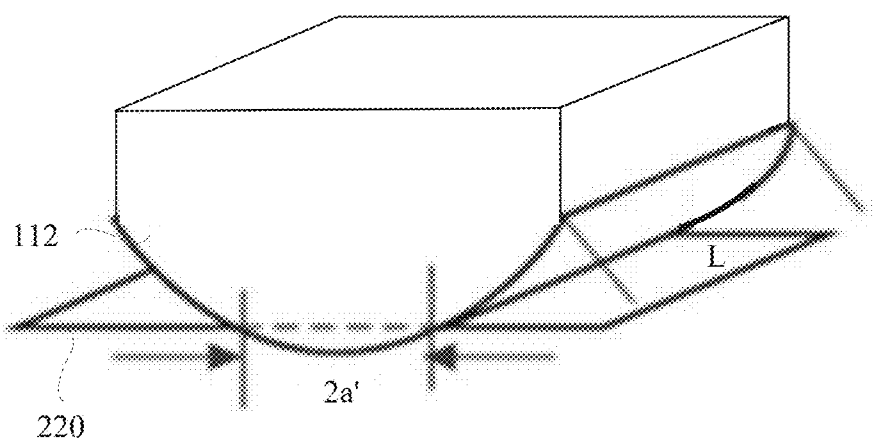
FIG. 16 is a schematic diagram of a structure when a through groove in a connection structure is in contact with a middle frame or a circuit board according to an embodiment of this application.

As shown in FIG. 15 and FIG. 16, a is a radius of a contact surface between the convex hull 116 and the middle frame 220, R is a radius of the convex hull 116, and 2a' and L are separately a characteristic side length of the through groove 112. When a current with a very high frequency passes through a conducting wire, it may be considered that the current flows only in a very thin layer on a surface of the conducting wire, and a higher frequency indicates a smaller skin depth (6). In a communication frequency of the electronic device 200, a skin depth is relatively small, which meets $a>\delta$ and $a'>\delta$. In a current application scenario, it may be roughly considered that $\delta=0.002$ mm.

Figure 17:
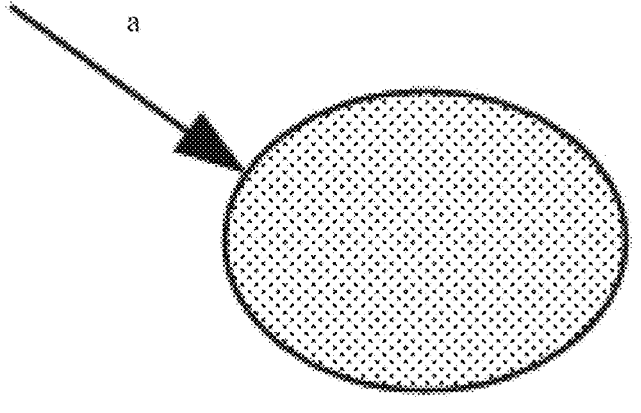
FIG. 17 is a schematic diagram of a structure when a convex hull in a connection structure is in contact with a middle frame or a circuit board according to an embodiment of this application.
Figure 18:
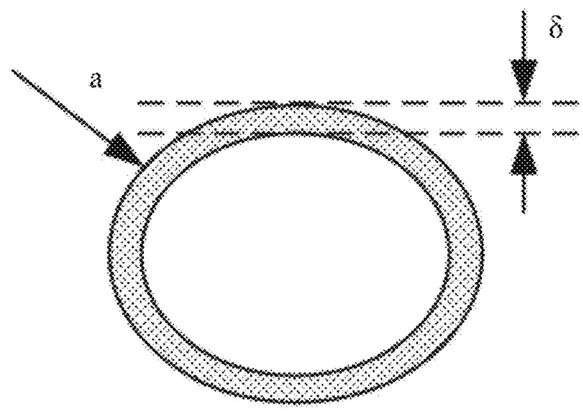
FIG. 18 is a schematic diagram of a structure when a convex hull in a connection structure is in contact with a middle frame or a circuit board according to an embodiment of this application.
Figure 19:
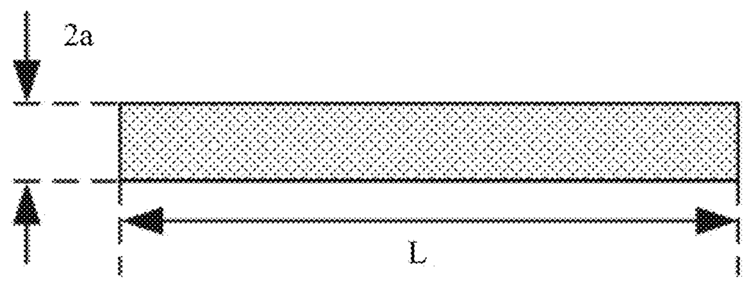
FIG. 19 is a schematic diagram of a structure when a through groove in a connection structure is in contact with a middle frame or a circuit board according to an embodiment of this application.
Figure 20:
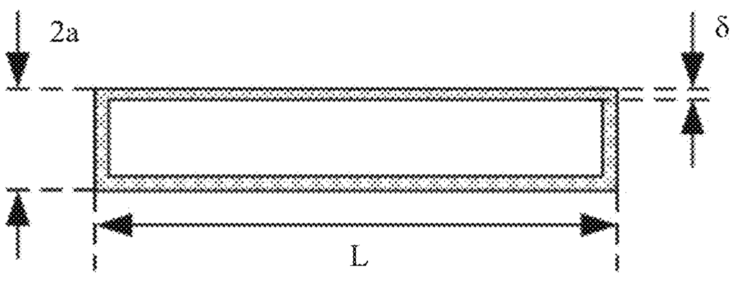
FIG. 20 is a schematic diagram of a structure when a through groove in a connection structure is in contact with a middle frame or a circuit board according to an embodiment of this application.

As shown in FIG. 17, when $a\leq\delta$, the contact surface between the convex hull 116 and the middle frame 220 is in a shape of a circle. As shown in FIG. 18, when $a>\delta$, the contact surface between the convex hull 116 and the middle frame 220 is in a shape of a circular ring. As shown in FIG. 19, when $a'\leq\delta$, the contact surface between the through groove 112 and the middle frame 220 is in a shape of a rectangle. As shown in FIG. 20, when $a'>\delta$, the contact surface between the convex hull 116 and the middle frame 220 is in a shape of a square ring.

For example, the convex hull is a ball-head convex hull. When the convex hull 116 and the through groove 112 occupy same space, it may be roughly considered, according to a formula principle, that a nominal contact area≈a circumference*a skin depth δ, a nominal contact area of the convex hull 116≈2*Π*a*δ, a nominal contact area of the through groove 112≈2*(2a'+L)*δ, and the convex hull 116/the through groove 112=(−Πa)/(2a'+L), where Π≈3.14. In this case, based on current design, the convex hull 116 interferes 0.08 mm, the through groove 112 interferes 0.05 mm, that is, a=0.26 mm, 2a'=0.54 mm, and L=0.52 mm, a percentage of the convex hull 116 to the through groove 112 is 78.5%. Therefore, the through groove 112 is designed with a larger nominal contact area and an effect is better.

In addition, if there is another bent feature around the metal structural member 110, the through groove 112 may be designed at a non-bent edge location. This can reduce molding difficulty of the through groove 112, ensure a size of the metal structural member 110, and reduce processing costs.

Figure 21:
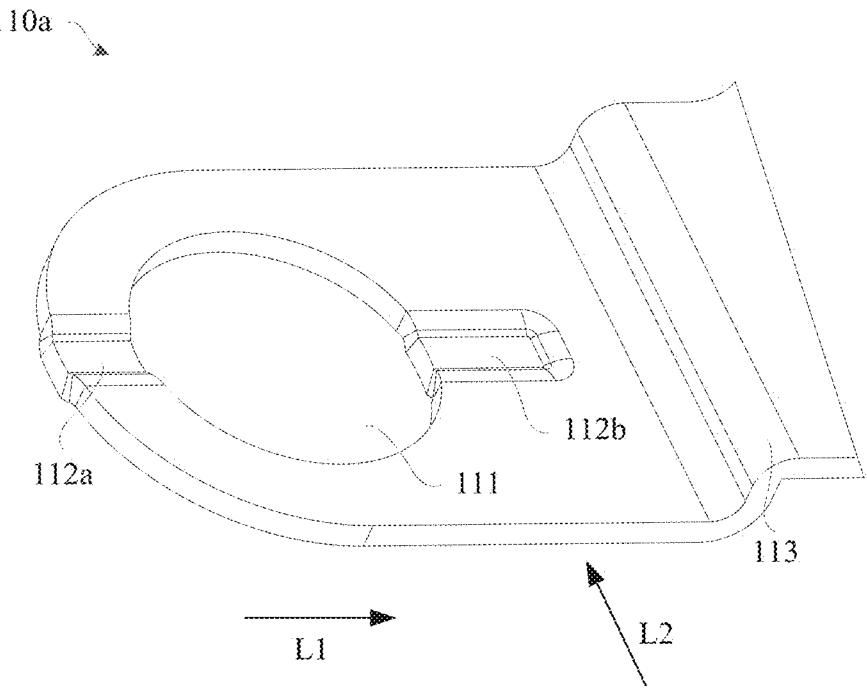
FIG. 21 is a schematic diagram of a front three-dimensional structure of another connection part in the connection structure shown in FIG. 11.
Figure 22:
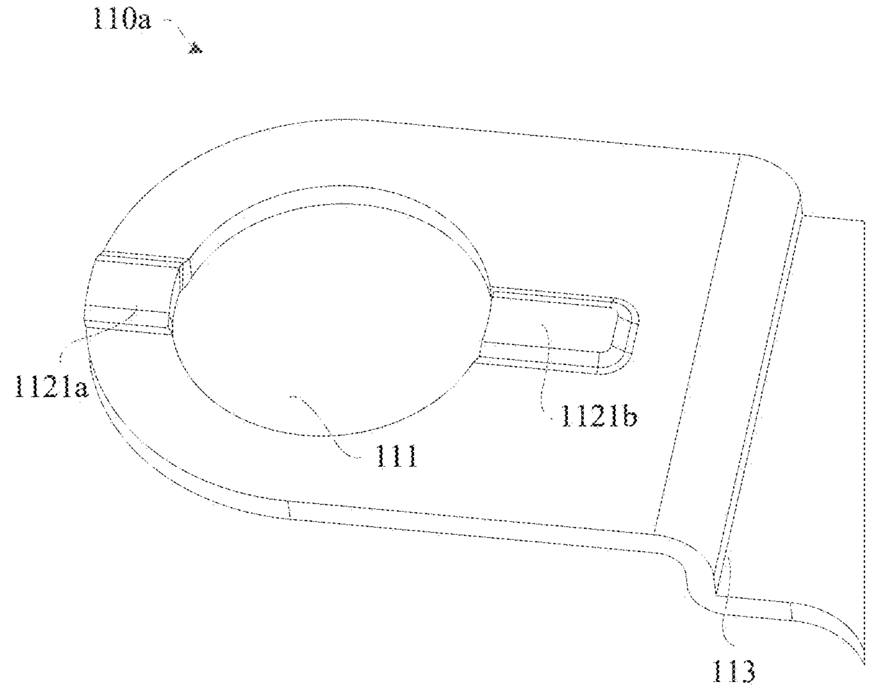
FIG. 22 is a schematic diagram of a rear three-dimensional structure of another connection part in the connection structure shown in FIG. 11.

If there is a bent edge only on one side, as shown in FIG. 21 and FIG. 22, an end of the first connection part 110*a* of the metal structural member 110 has a bent edge 113, and an extension direction L1 of the through groove may be perpendicular to a length direction L2 of the bent edge. For example, in FIG. 21 and FIG. 22, the through groove 112 may be molded at a location perpendicular to the bent edge 113. In this case, a distance usually needs to be reserved between the through groove 112 and the bent edge 113, to prevent the bent edge 113 from interfering with the through groove 112.

Specifically, as shown in FIG. 21 and FIG. 22, a first through groove 112*a* and a second through groove 112*b* are molded at the location perpendicular to the bent edge 113, a surface of a groove surface 1121*a* of the first through groove facing away from the middle frame 220 and a surface of a groove surface 1121*b* of the second through groove facing away from the middle frame 220 are recessed, and a surface of a groove bottom 1122*a* of the first through groove facing the middle frame 220 and a surface of a groove bottom 1122*b* of the second through groove facing the middle frame 220 are protruded.

Alternatively, in some other embodiments, the extension direction L1 of the through groove may be parallel to the length direction L2 of the bent edge.

By designing the extension direction L1 of the through groove to be parallel to the length direction L2 of the bent edge, the bent edge 113 of the metal structural member 110 is not damaged when the through groove 112 is produced, for example, when stamping molding is performed on the through groove 112. In addition, the extension direction L1 of the through groove is parallel to the length direction L2 of the bent edge, so that the bent edge 113 of the metal structural member 110 does not interfere with a process of producing the through groove 112, thereby preventing existence of the bent edge 113 from affecting stability and reliability of the process of producing the through groove 112.

Figure 23:
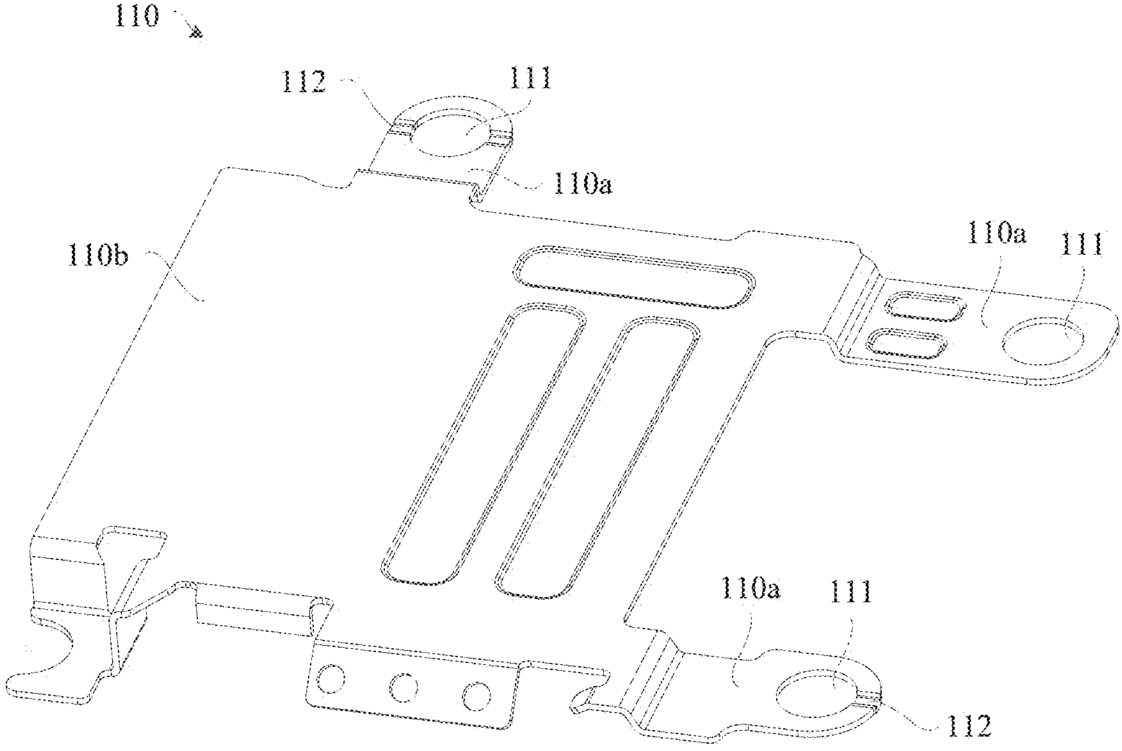
FIG. 23 is a schematic diagram of a three-dimensional structure of a connection structure in an electronic device according to an embodiment of this application.
Figure 24:
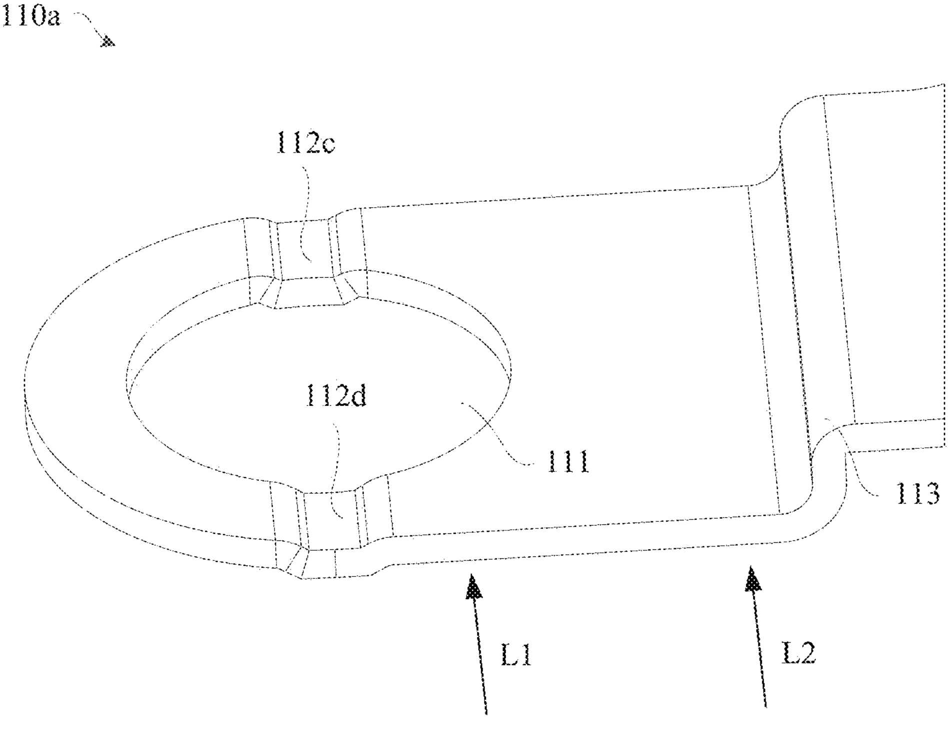
FIG. 24 is a schematic diagram of a front three-dimensional structure of a connection part in the connection structure shown in FIG. 23.
Figure 25:
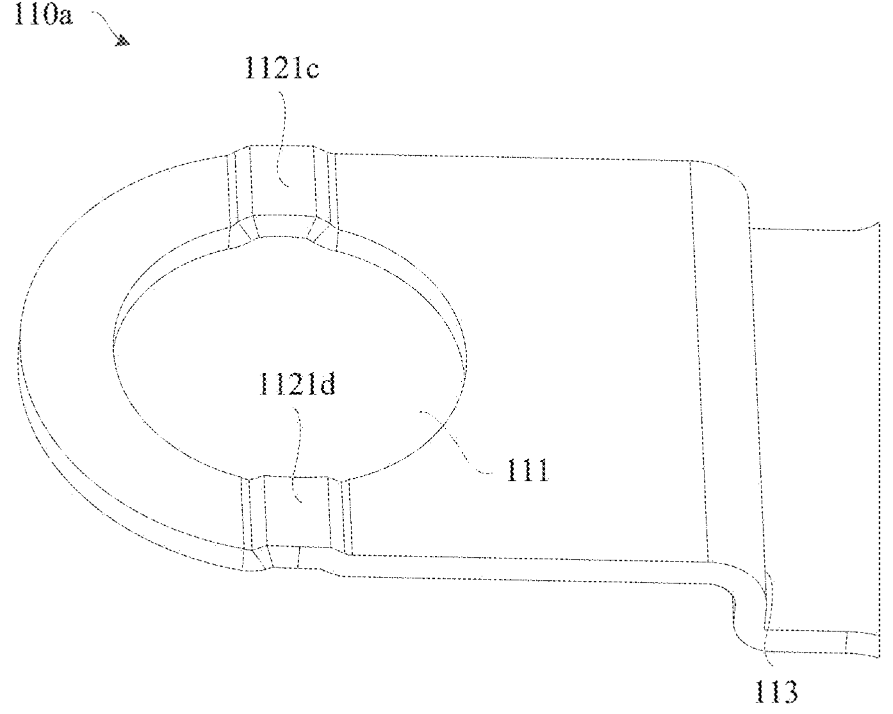
FIG. 25 is a schematic diagram of a rear three-dimensional structure of a connection part in the connection structure shown in FIG. 23.

Specifically, in FIG. 23 to FIG. 25, two symmetrical through grooves 112 may be molded at a location parallel to the bent edge 113, and the two through grooves 112 may be molded at one time. As shown in FIG. 24 and FIG. 25, a third through groove 112*c* and a fourth through groove 112*d* that are symmetrical to each other are molded at the location parallel to the bent edge 113, a surface of a groove surface 1121*c* of the third through groove facing away from the middle frame 220 and a surface of a groove surface 1121*d* of the fourth through groove facing away from the middle frame 220 are recessed, and a surface of a groove bottom 1122*c* of the third through groove facing the middle frame 220 and a surface of a groove bottom 1122*d* of the fourth through groove facing the middle frame 220 are protruded.

Figure 26:
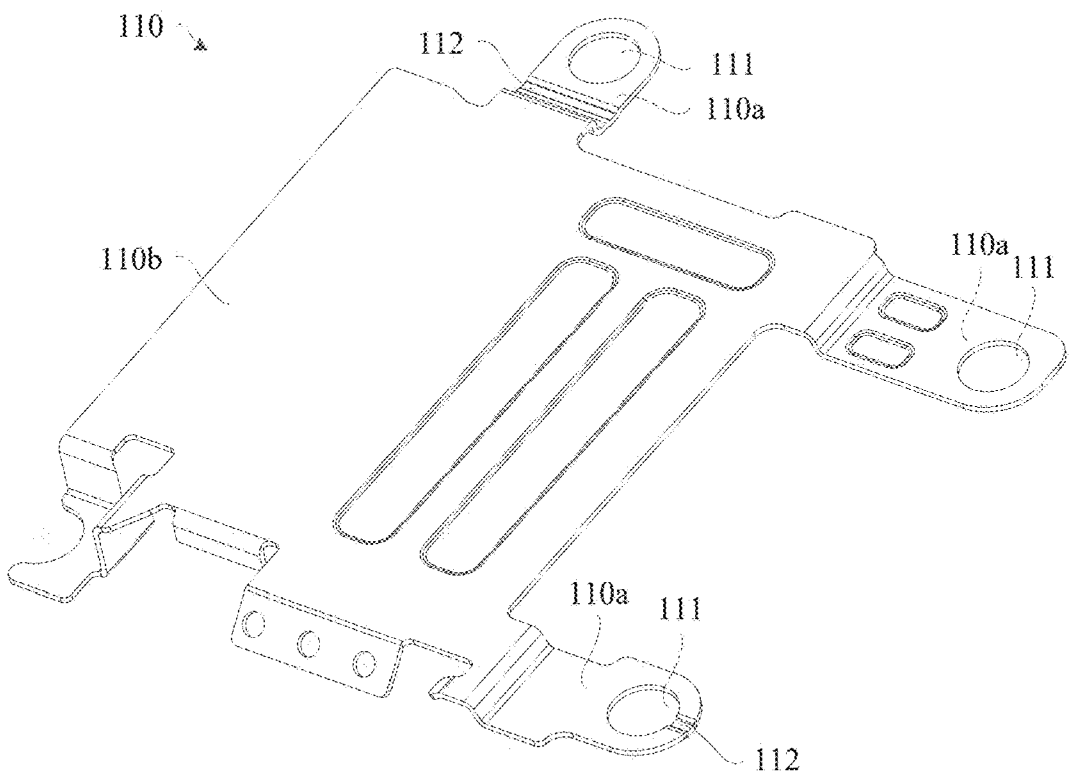
FIG. 26 is a schematic diagram of a three-dimensional structure of a connection structure in an electronic device according to an embodiment of this application.
Figure 27:
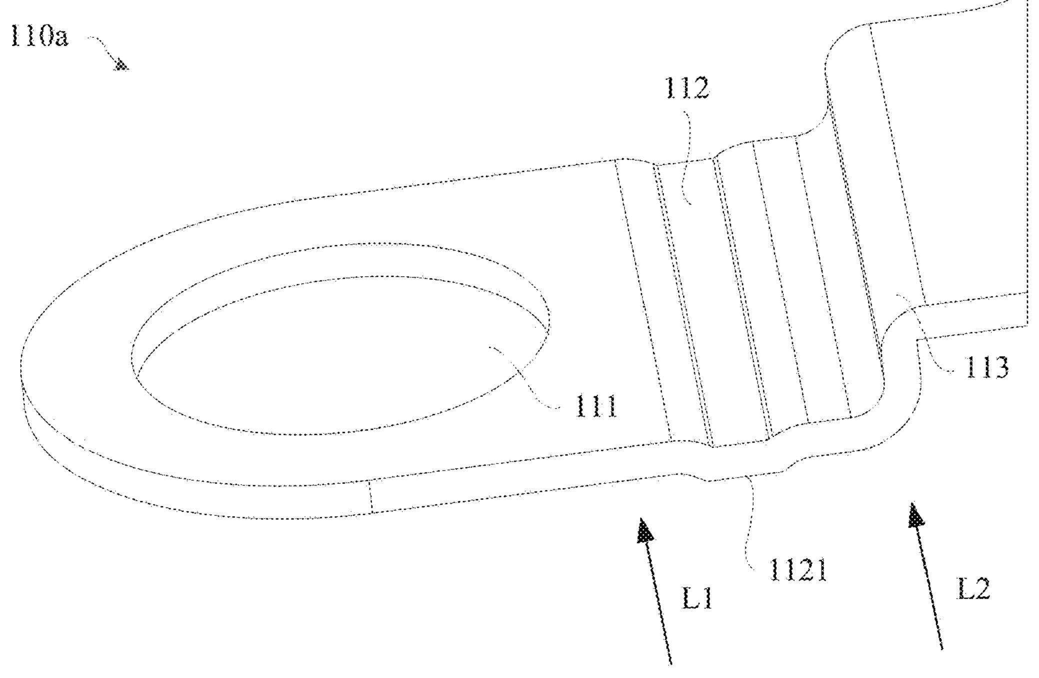
FIG. 27 is a schematic diagram of a front three-dimensional structure of a connection part in the connection structure shown in FIG. 26.
Figure 28:
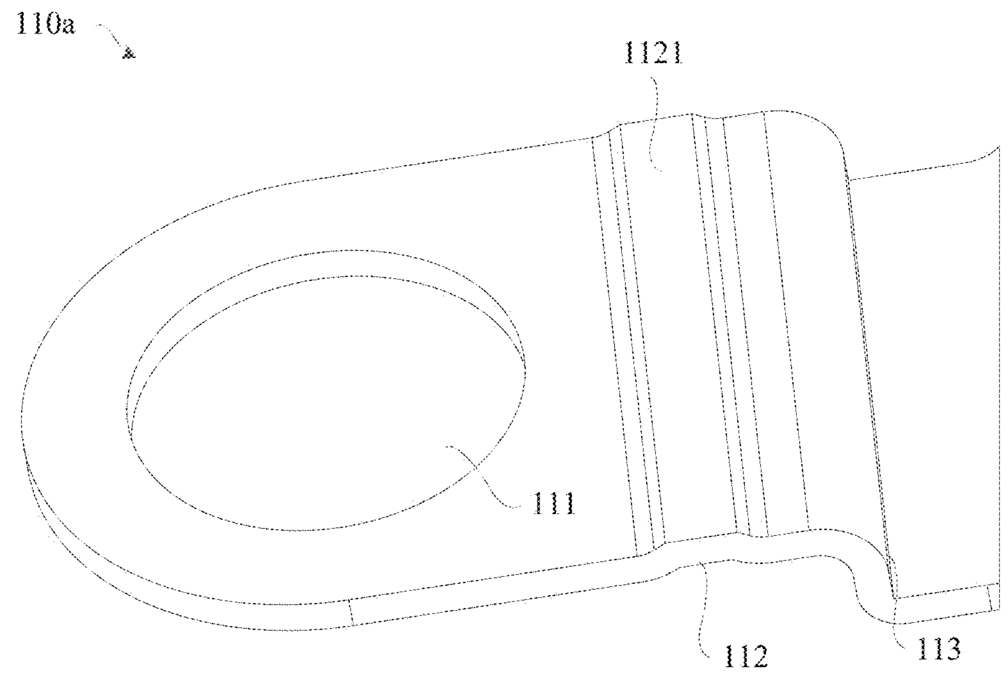
FIG. 28 is a schematic diagram of a rear three-dimensional structure of a connection part in the connection structure shown in FIG. 26.

Alternatively, in FIG. 26 to FIG. 28, one through groove 112 may be molded at the location parallel to the bent edge 113, and the through groove 112 may also be molded at one time.

Figure 29:
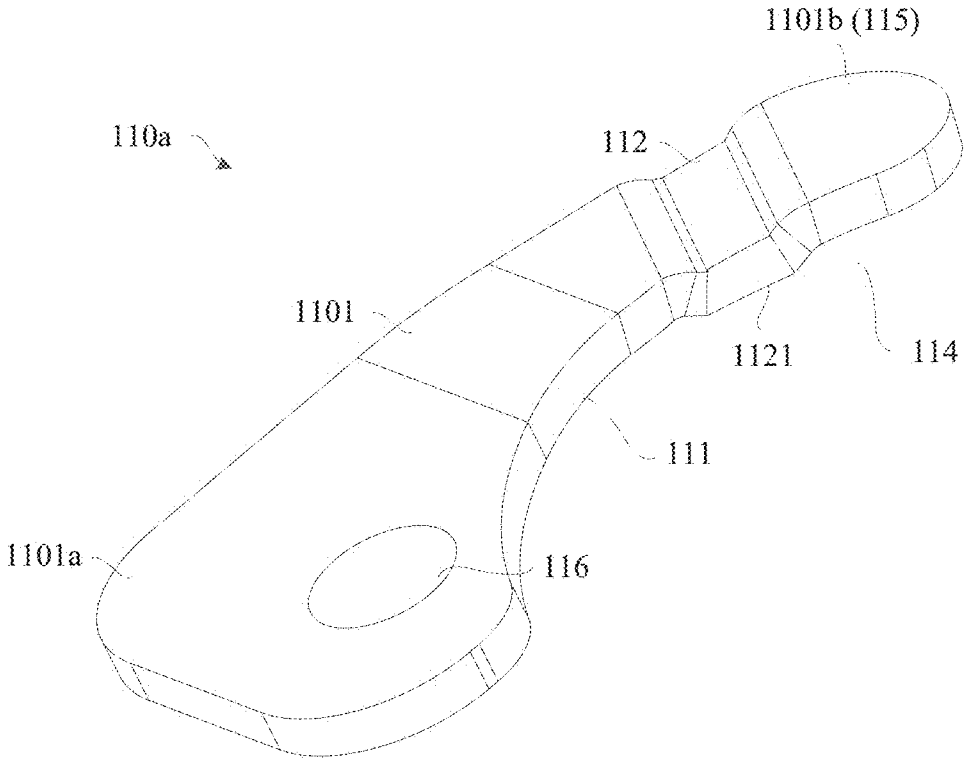
FIG. 29 is a schematic diagram of a front three-dimensional structure in which a through groove is located on an elastic arm when a connection part in a connection structure is a two-claw structure according to an embodiment of this application.
Figure 31:
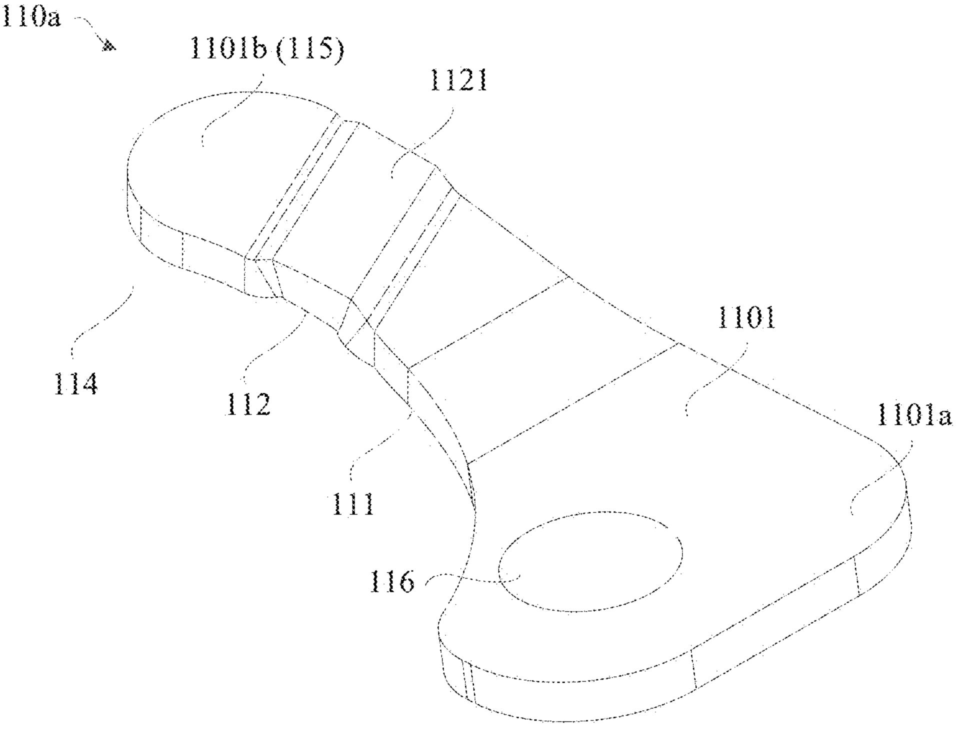
FIG. 31 is a schematic diagram of a rear three-dimensional structure in which a through groove is located on an elastic arm when a connection part in a connection structure is a two-claw structure according to an embodiment of this application.

It may be understood that, in some embodiments, the metal structural member 110 may have a notch 114, and the notch 114 may be in communication with the first through hole 111, so that at least one elastic arm 115 is formed on the metal structural member 110 (refer to FIG. 29 and FIG. 31). By providing the notch 114 on the metal structural member 110, the metal structural member 110 implements disconnection design. Because the metal structural member 110 has the first through hole 111, and the notch 114 is in communication with the first through hole 111, at least one end of the metal structural member 110 is suspended, and the end designed to be suspended has relative elasticity, thereby ensuring that the at least one elastic arm 115 is formed on the metal structural member 110.

In addition, in some other embodiments, the metal structural member 110 may have a notch 114, and the notch 114 is in communication with the first through hole 111. However, the metal structural member 110 may not have the elastic arm 115. In this case, compared with the metal structural member 110 on which the elastic arm 115 is formed, the metal structural member 110 without the elastic arm 115 has a relatively poor effect on absorbing a gap between the metal structural member 110 and the circuit board 230.

Specifically, in a scenario of the convex hull 116 having no elastic arm 115, only a screw floating height of about 0.08 mm can be absorbed, but an actual floating height may far exceed this height. After mechanical reliability is ensured, a screw has a floating height of about 0.15 mm. In consideration of a design height, the metal structural member 110 needs to have an elastic force greater than 0.7 N when the metal structural member 110 is at a working height of 0.35 mm. Therefore, the elastic arm 115 needs to be added to an original closed metal structural member 110. This design can ensure that the metal structural member 110 is used at a location at which a radio frequency current is relatively high, at an ESD sensitive location, or in a scenario in which impedance before and after environment reliability is strictly required, to ensure that a function does not fail.

It should be noted that in this embodiment of this application, an application scenario of the metal structural member 110 is not limited to a screw locking scenario only.

For the metal structural member 110 with the elastic arm 115, the through groove 112 (for example, a U-shaped groove) may also be used to improve contact reliability. Specifically, a feature of the through groove 112 may be provided on the elastic arm 115, or may be provided at a location outside the elastic arm 115 (namely, a region location on the metal structural member 110 outside the elastic arm 115). In this embodiment of this application, the extension direction L1 of the through groove is not specially limited, and the through groove 112 may usually follow a radius direction of an inner circle of the metal structural member 110.

For example, in this embodiment of this application, one elastic arm 115 is formed on the metal structural member 110, and the through groove 112 may be located on the elastic arm 115. In this way, on a basis that the elastic arm 115 absorbs a connection gap between the metal structural member 110 and the middle frame 220 to some extent, the through groove 112 can further squeeze and absorb a gap between the metal structural member 110 and the middle frame 220.

Alternatively, in some embodiments, the through groove 112 may alternatively be located in a region on the metal structural member 110 outside the elastic arm 115. In this case, the through groove 112 can also further squeeze and absorb a gap between the metal structural member 110 and the middle frame 220 on a basis of the elastic arm 115.

To be specific, when the through groove 112 is provided on the metal structural member 110, regardless of whether the through groove 112 is provided on the elastic arm 115 or the through groove 112 is provided in the region on the metal structural member 110 except the elastic arm 115, as long as the surface of the groove bottom 1122 of the through groove facing the middle frame 220 is protruded, the groove bottom 1122 of the through groove can squeeze the middle frame 220, so that a gap between the metal structural member 110 and the middle frame 220 can be well absorbed, thereby avoiding, to a great extent, a problem that there is a gap between the structural member and the circuit board 230 in scenarios such as falling.

It should be noted that in this embodiment of this application, a structure of the metal structural member 110 includes but is not limited to the following several possible implementations:

In a possible implementation, as shown in FIG. 29 to FIG. 33, the metal structural member 110 may include a first part 1101, the first part 1101 has a first end and a second end (namely, a first end 1101*a* of the first part and a second end 1101*b* of the first part) that are opposite to each other, and the second end 1101*b* of the first part serves as the elastic arm 115. In this case, a metal structural member 110 having one elastic arm 115 forms a two-claw metal structural member 110.

Figure 32:
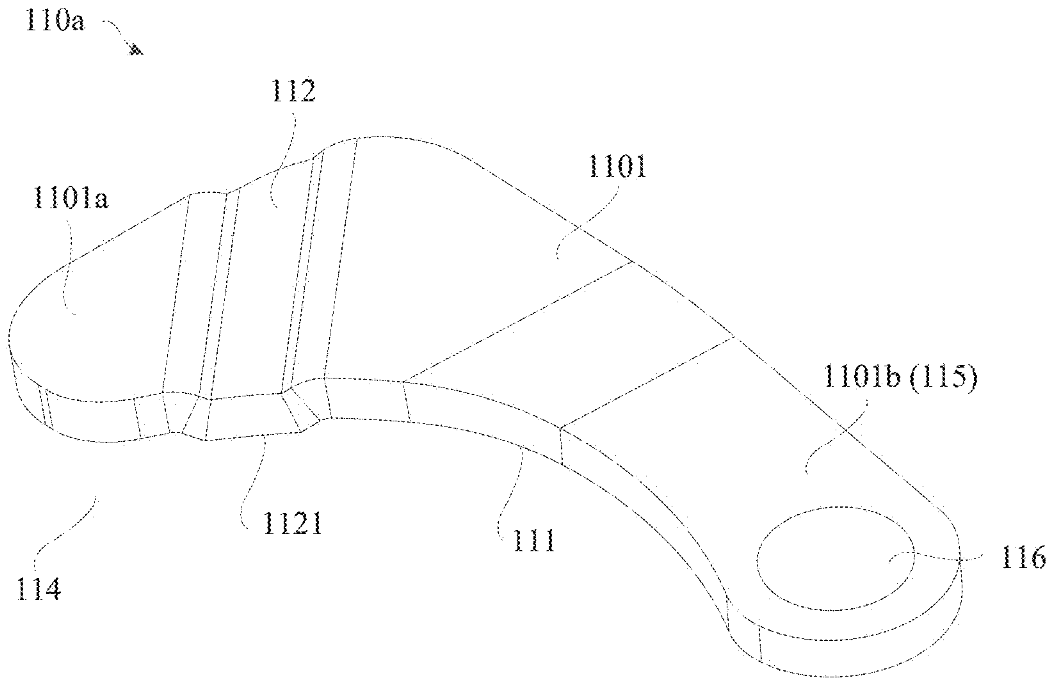
FIG. 32 is a schematic diagram of a front three-dimensional structure in which a through groove is located outside an elastic arm when a connection part in a connection structure is a two-claw structure according to an embodiment of this application.
Figure 33:
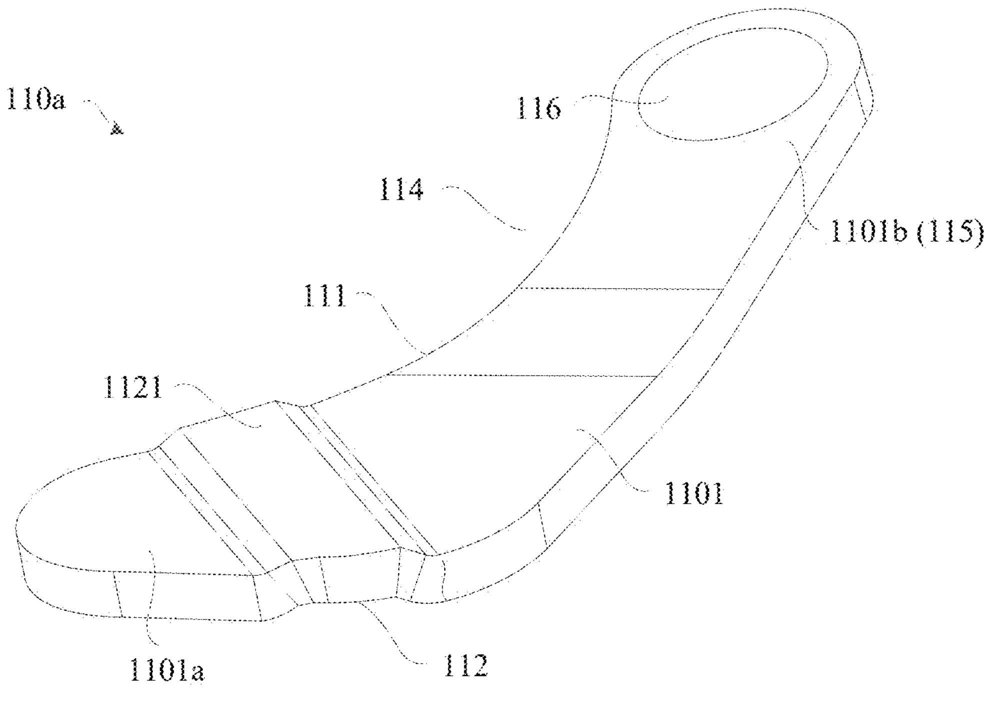
FIG. 33 is a schematic diagram of a rear three-dimensional structure in which a through groove is located outside an elastic arm when a connection part in a connection structure is a two-claw structure according to an embodiment of this application.

In FIG. 29, FIG. 30, and FIG. 31, the metal structural member 110 is the two-claw metal structural member 110, and the through groove 112 is located on the elastic arm 115. In FIG. 32 and FIG. 33, the metal structural member 110 is the two-claw metal structural member 110, and the through groove 112 is located in a region on the two-claw metal structural member 110 outside the elastic arm 115. In addition, the metal structural member 110 has one through groove 112 and one convex hull 116.

In another possible implementation, as shown in FIG. 34 to FIG. 37, the metal structural member 110 includes the first part 1101 and a second part 1102, the second part 1102 has a first end and a second end (namely, a first end 1102*a* of the second part and a second end 1102*b* of the second part) that are opposite to each other, the second end 1101*b* of the first part serves as the elastic arm 115, and the first end 1102*a* of the second part is connected to the first end 1101*a* of the first part. In this case, the first end 1102*a* of the second part is connected to the first end 1101*a* of the first part, and a metal structural member 110 having one elastic arm 115 forms a three-claw metal structural member 110.

Figure 34:
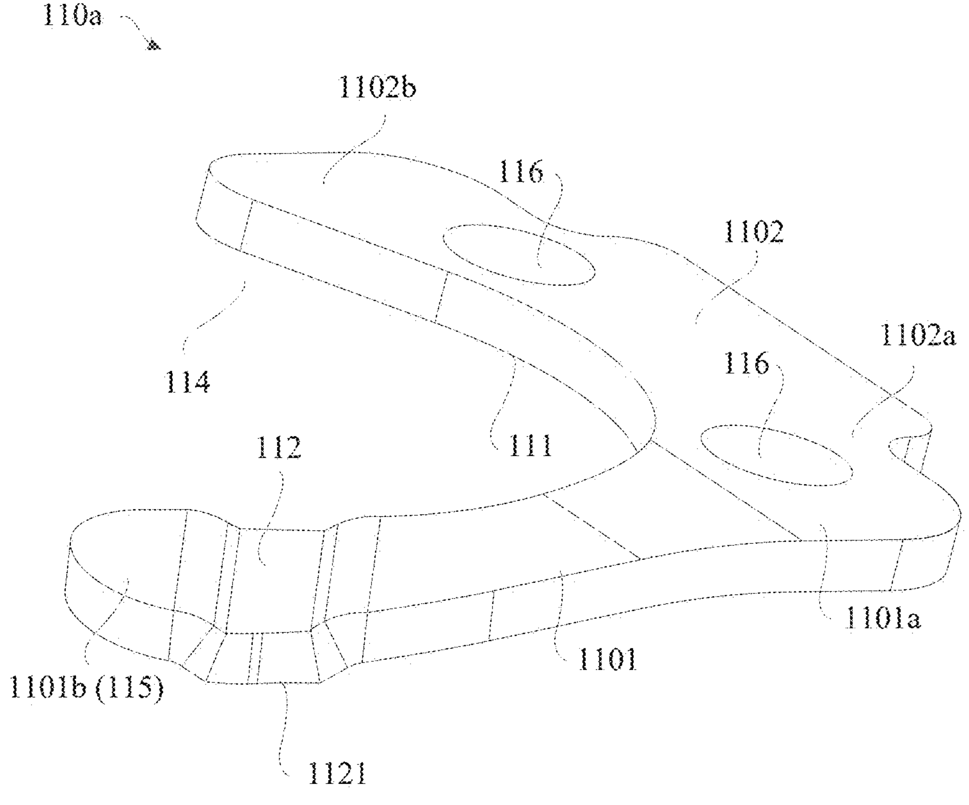
FIG. 34 is a schematic diagram of a front three-dimensional structure in which a through groove is located on an elastic arm when a connection part in a connection structure is a three-claw structure according to an embodiment of this application.
Figure 35:
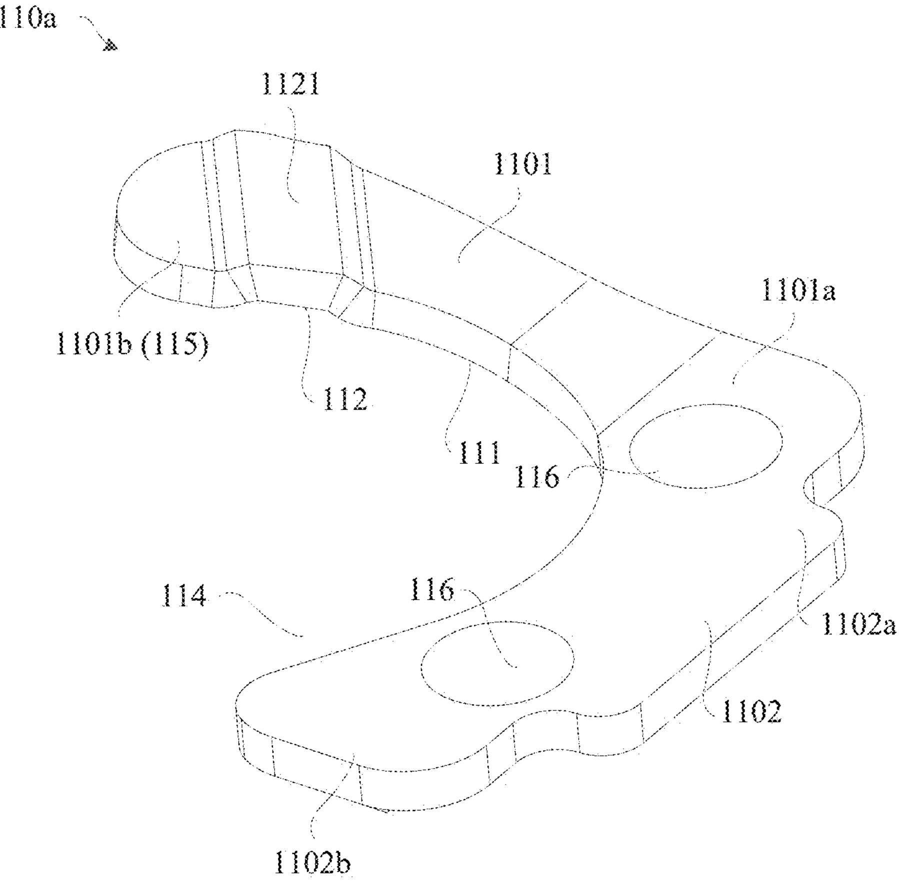
FIG. 35 is a schematic diagram of a rear three-dimensional structure in which a through groove is located on an elastic arm when a connection part in a connection structure is a three-claw structure according to an embodiment of this application.
Figure 36:
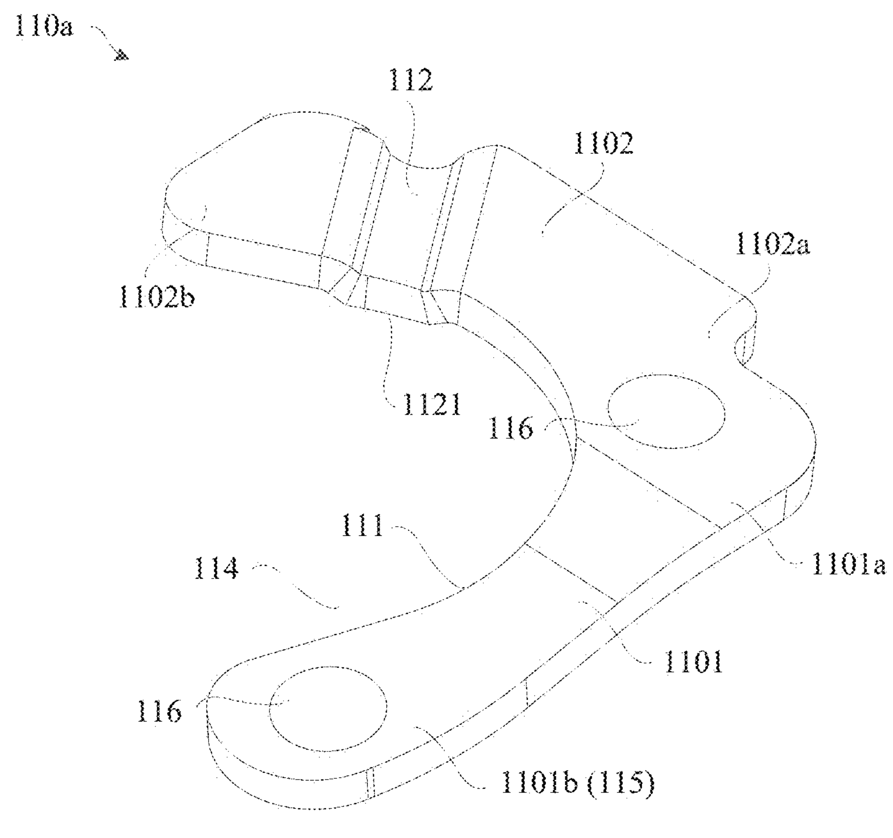
FIG. 36 is a schematic diagram of a front three-dimensional structure in which a through groove is located outside an elastic arm when a connection part in a connection structure is a three-claw structure according to an embodiment of this application.
Figure 37:
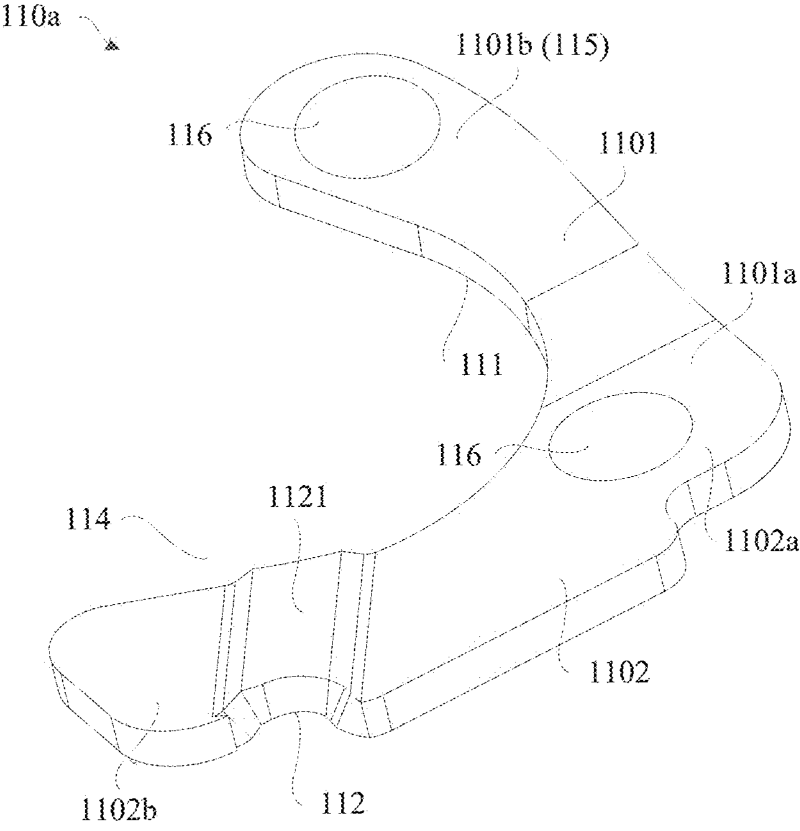
FIG. 37 is a schematic diagram of a rear three-dimensional structure in which a through groove is located outside an elastic arm when a connection part in a connection structure is a three-claw structure according to an embodiment of this application.

In FIG. 34 and FIG. 35, the metal structural member 110 is the three-claw metal structural member 110, and the through groove 112 is located on the elastic arm 115. In FIG. 36 and FIG. 37, the metal structural member 110 is the three-claw metal structural member 110, and the through groove 112 is located in a region on the three-claw metal structural member 110 outside the elastic arm 115. In addition, the metal structural member 110 has one through groove 112 and two convex hulls 116.

In still another possible implementation, as shown in FIG. 38 to FIG. 41, the metal structural member 110 includes the first part 1101, the second part 1102, and a third part 1103, the third part 1103 has a first end and a second end (namely, a first end 1103*a* of the third part and a second end 1103*b* of the third part) that are opposite to each other, and the second end 1101*b* of the first part serves as the elastic arm 115. In this case, the first end 1102*a* of the second part is connected to the first end 1101*a* of the first part, the second end 1102*b* of the second part is connected to the first end 1103*a* of the third part, and a metal structural member 110 having one elastic arm 115 forms a four-claw metal structural member 110.

Figure 38:
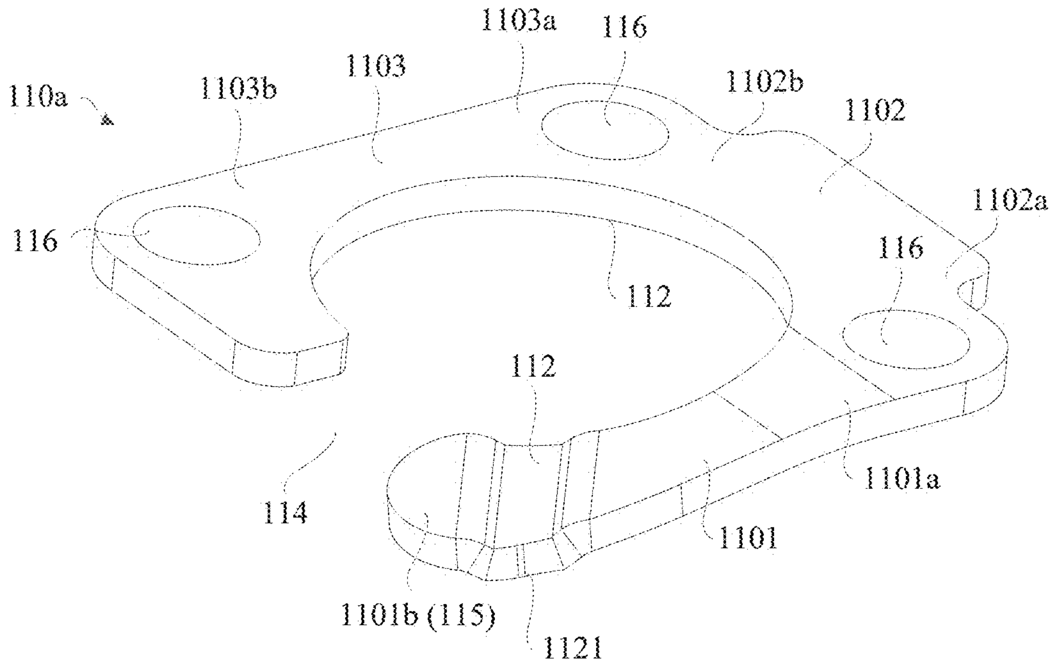
FIG. 38 is a schematic diagram of a front three-dimensional structure in which a through groove is located on an elastic arm when a connection part in a connection structure is a four-claw structure according to an embodiment of this application.
Figure 39:
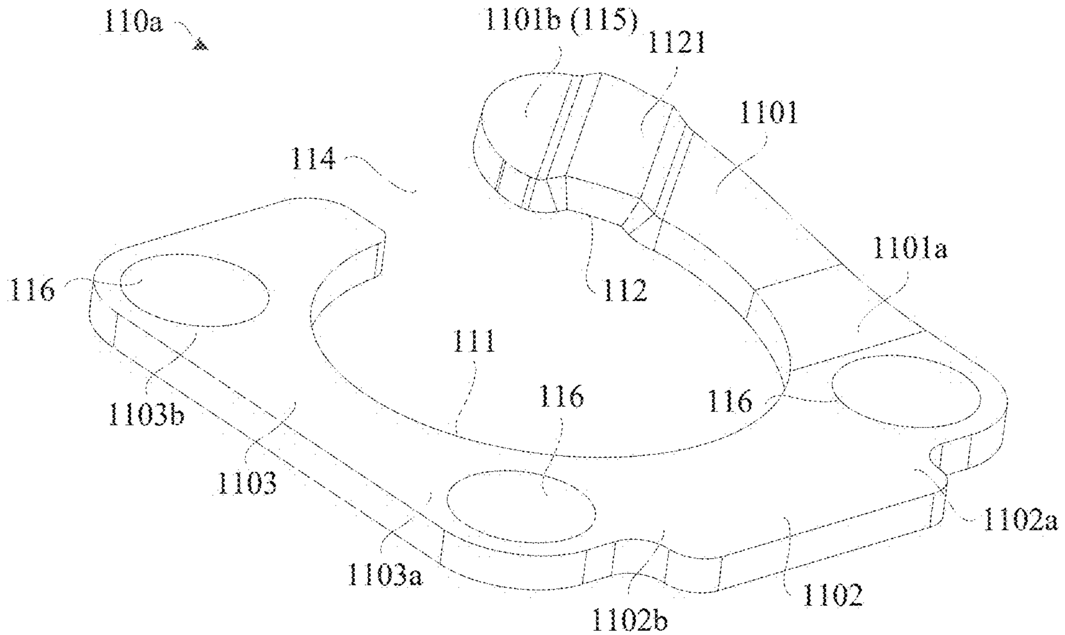
FIG. 39 is a schematic diagram of a rear three-dimensional structure in which a through groove is located on an elastic arm when a connection part in a connection structure is a four-claw structure according to an embodiment of this application.
Figure 40:
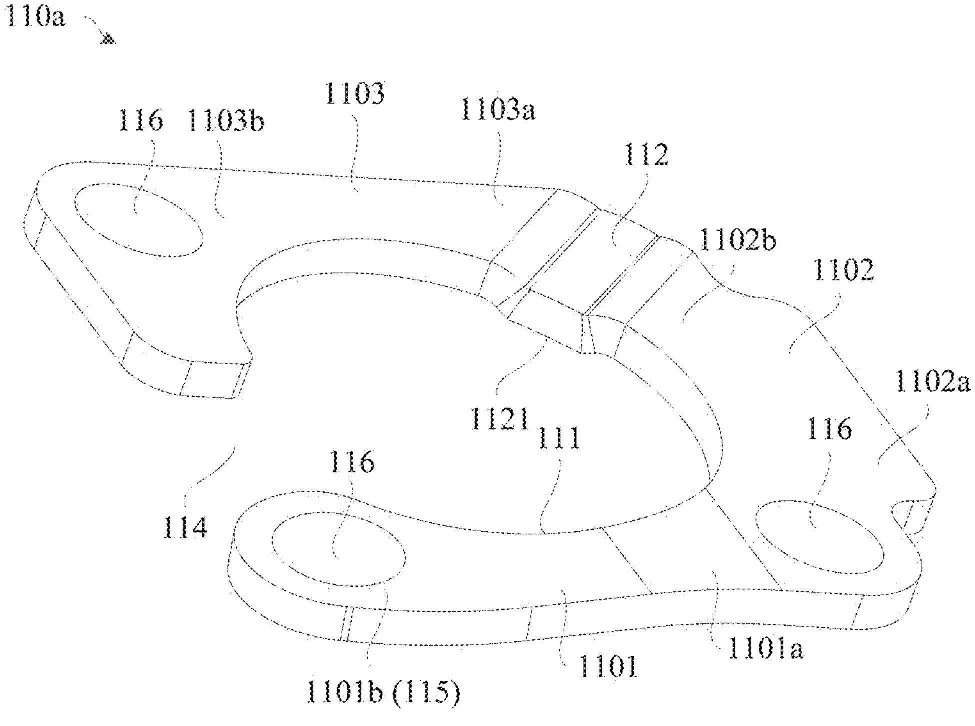
FIG. 40 is a schematic diagram of a front three-dimensional structure in which a through groove is located outside an elastic arm when a connection part in a connection structure is a four-claw structure according to an embodiment of this application.
Figure 41:
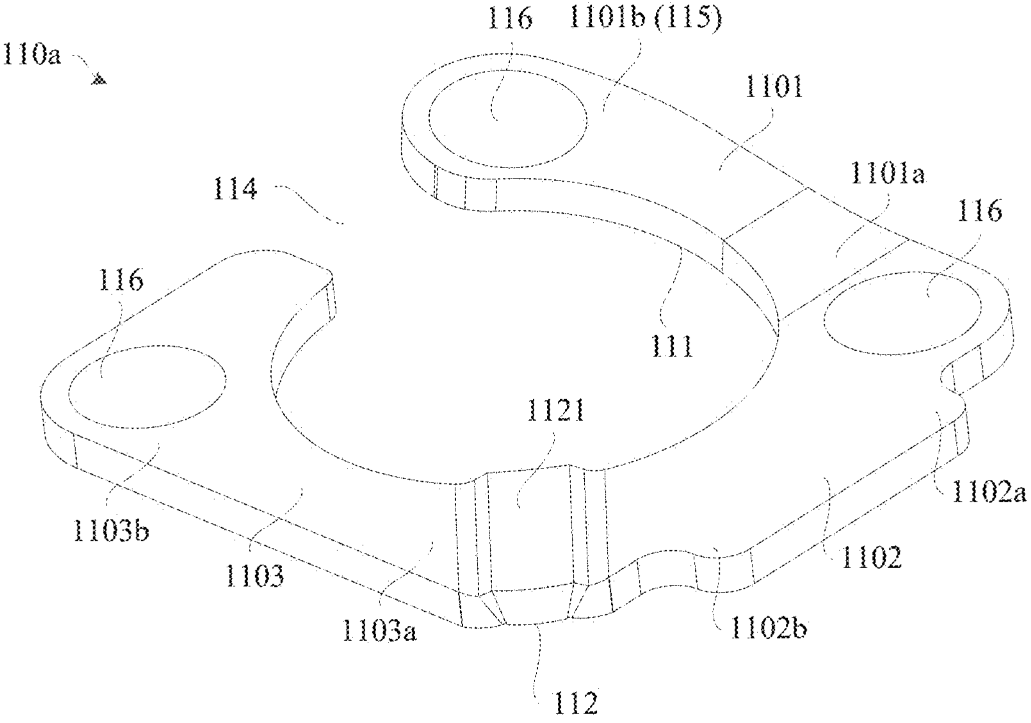
FIG. 41 is a schematic diagram of a rear three-dimensional structure in which a through groove is located outside an elastic arm when a connection part in a connection structure is a four-claw structure according to an embodiment of this application.

Specifically, in FIG. 38 and FIG. 39, the metal structural member 110 is the four-claw metal structural member 110, and the through groove 112 is located on the elastic arm 115. In FIG. 40 and FIG. 41, the metal structural member 110 is the four-claw metal structural member 110, and the through groove 112 is located in a region on the four-claw metal structural member 110 outside the elastic arm 115. In addition, the metal structural member 110 has one through groove 112 and three convex hulls 116.

It may be understood that, in this embodiment of this application, the metal structural member 110 is not limited to layouts shown in FIG. 9 and FIG. 10, provided that the metal structural member 110 is a layer of multi-layer contact, and the contact surface is not limited. The metal structural member 110 may be a metal structural member 110; or may not be limited to a structural member of metal, and may be replaced by any material to implement effective contact between the two. It does not necessarily have to be for a purpose of a conduction relationship, and reliable contact of a structure itself can also be beneficial.

For example, in some embodiments, the connection structure 100 may further include a plastic structural member 130. With reference to FIG. 10 and FIG. 11, the plastic structural member 130 is connected to the first connection part 110*a* of the metal structural member 110 by using the fastener 120. It may be understood that the fastener 120 may be a structure such as a screw, a stud, or a bolt. This is not limited in this embodiment of this application, and is not limited to the foregoing example.

It should be noted herein that a location at which the plastic structural member 130 is combined with the metal structural member 110 may be a location at which the fastener 120 is located, or may be a location except the fastener 120. In some embodiments, the plastic structural member 130 and the fastener 120 may be molded integrally before locking the fastener 120 on the metal structural member 110. Therefore, a layout of the fastener 120 is not a key condition that affects a combination location of the plastic structural member 130 and the metal structural member 110.

It is easy to understand that in this embodiment of this application, the plastic structural member 130 and the metal structural member 110 may be molded by injection, to further ensure connection reliability between the metal structural member 110 and the middle frame 220 or between the metal structural member 110 and the circuit board 230. In addition, injection molding of the plastic structural member 130 and the metal structural member 110 can also improve the overall reliability of the plastic structural member 130 and the metal structural member 110 to some extent. In addition, in some embodiments, the plastic structural member 130 can provide an insulation or isolation effect at some locations.

In the descriptions of the embodiments of this application, it should be noted that, unless otherwise explicitly specified and defined, the terms "mount", "communicate", and "connect" should be understood in a broadest sense, for example, may be a fixed connection, an indirect connection by using an intermediate medium, or communication inside two elements or an interactive relationship between two elements. A person of ordinary skill in the art may understand specific meanings of the foregoing terms in the embodiments of this application based on a specific situation.

The apparatus or element referred to or implied in the embodiments of this application needs to have a specific orientation, be constructed and operated in a specific orientation, and therefore cannot be construed as a limitation on the embodiments of this specification. In the descriptions of the embodiments of this application, "a plurality of" means two or more, unless otherwise specifically specified.

The terms "first", "second", "third", "fourth", and the like (if existent) in the specification, claims, and accompanying drawings of the embodiments of this application are used to distinguish between similar objects, but are not necessarily used to describe a particular order or sequence. It should be understood that data used in such a way is interchangeable in proper situations, so that the embodiments of this application described herein can be implemented, for example, in orders other than those illustrated or described herein. In addition, the terms "may include", "have", and any variation thereof are intended to cover non-exclusive inclusion. For example, a process, a method, a system, a product, or a device that includes a series of steps or units is not necessarily limited to those steps or units that are clearly listed, but may include other steps or units that are not clearly listed or are inherent to the process, the method, the product, or the device.

Finally, it should be noted that the foregoing embodiments are merely used to describe but not limit the technical solutions of the embodiments of this application. Although the embodiments of this application are described in detail with reference to the foregoing embodiments, it should be understood by a person of ordinary skill in the art that the technical solutions described in the foregoing embodiments may still be modified, or some or all technical features thereof may be equivalently replaced. These modifications or replacements do not make the essence of the corresponding technical solutions depart from the scope of the technical solutions of the embodiments of this application.

The invention claimed is:

1. An electronic device, comprising:

a middle frame;

a metal structural member; and a fastener;

wherein the metal structural member has a first through hole, the middle frame has a second through hole, and the fastener passes through the first through hole and the second through hole;

wherein a through groove is provided on the metal structural member, a surface of the through groove facing away from the middle frame is recessed, and the through groove extends to at least one outer edge of the metal structural member; and wherein a surface of the through groove facing the middle frame is protruded.

2. The electronic device according to claim 1, wherein the through groove is formed by using a stamping process.

3. The electronic device according to claim 1, wherein the through groove is connected to the first through hole.

4. The electronic device according to claim 1, wherein a contact surface between the through groove and the middle frame is in a shape of a rectangle or a square ring.

5. The electronic device according to claim 1, wherein at least one convex hull is further disposed on the metal structural member.

6. The electronic device according to claim 5, wherein a surface of the convex hull facing the middle frame is protruded and a surface of the convex hull facing away from the middle frame is a flat surface.

7. The electronic device according to claim 5, wherein a contact surface between the convex hull and the middle frame is in a shape of a circle or a circular ring.

8. The electronic device according to claim 1, wherein an end of the metal structural member has a bent edge; and wherein an extension direction of the through groove is parallel to a length direction of the bent edge.

9. The electronic device according to claim 1, wherein the metal structural member has a notch and the notch is in communication with the first through hole, so that at least one elastic arm is formed on the metal structural member.

10. The electronic device according to claim 9, wherein the elastic arm is formed on the metal structural member; and wherein the through groove is located on the elastic arm, or the through groove is located in a region on the metal structural member outside the elastic arm.

11. The electronic device according to claim 9, wherein the metal structural member comprises a first part; and wherein the first part has a first end and a second end that are opposite to each other, and the second end serves as the elastic arm.

12. The electronic device according to claim 11, wherein the metal structural member further comprises a second part comprising a first end and a second end, and the first end of the second part is connected to the first end of the first part.

13. The electronic device according to claim 12, wherein the metal structural member further comprises a third part, and the second end of the second part is connected to the third part.

14. The electronic device according to claim 13, further comprising:

a circuit board, wherein the circuit board is located between the metal structural member and the middle frame; and wherein the through groove is located on a surface of the metal structural member facing away from the circuit board, and a surface of the through groove facing the circuit board is protruded.

15. A connection structure, applied to the electronic device according to claim 1, wherein the metal structural member comprises a first connection part, and the middle frame comprises a second connection part;

wherein the first connection part has the first through hole, the second connection part has the second through hole, and the fastener passes through the first through hole and the second through hole;

wherein the through groove is provided on the first connection part, the surface of the through groove facing away from the second connection part is recessed, and the through groove extends to at least one outer edge of the first connection part; and wherein the surface of the through groove facing the second connection part is protruded.

16. The connection structure according to claim 15, wherein the through groove is connected to the first through hole.

17. The connection structure according to claim 15, wherein at least one convex hull is further disposed on the first connection part.

18. The connection structure according to claim 15, wherein the first connection part has a notch and the notch is in communication with the first through hole, so that at least one elastic arm is formed on the first connection part; and wherein the through groove is located on the elastic arm, or the through groove is located in a region on the first connection part outside the elastic arm.

* * * * *